(12) United States Patent
Jung et al.

(10) Patent No.: US 11,856,872 B2
(45) Date of Patent: Dec. 26, 2023

(54) VARIABLE RESISTANCE MEMORY DEVICE AND METHOD OF MANUFACTURING THE SAME

(71) Applicant: Samsung Electronics Co., Ltd., Suwon-si (KR)

(72) Inventors: Jaeho Jung, Seoul (KR); Kwangmin Park, Seoul (KR); Jonguk Kim, Yongin-si (KR); Dongsung Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 520 days.

(21) Appl. No.: 17/204,599

(22) Filed: Mar. 17, 2021

(65) Prior Publication Data
US 2022/0013722 A1 Jan. 13, 2022

(30) Foreign Application Priority Data
Jul. 9, 2020 (KR) ........................ 10-2020-0084795

(51) Int. Cl.
*H01L 45/00* (2006.01)
*H10N 70/00* (2023.01)
*H10B 63/00* (2023.01)

(52) U.S. Cl.
CPC ......... *H10N 70/066* (2023.02); *H10B 63/845* (2023.02); *H10N 70/063* (2023.02); *H10N 70/068* (2023.02); *H10N 70/841* (2023.02); *H10N 70/883* (2023.02)

(58) Field of Classification Search
CPC ... H10N 70/066; H10N 70/883; H10N 70/841
See application file for complete search history.

(56) References Cited

U.S. PATENT DOCUMENTS

| | | | |
|---|---|---|---|
| 8,183,121 B2 | 5/2012 | Schricker et al. | |
| 8,466,044 B2 | 6/2013 | Xu | |
| 8,471,360 B2 | 6/2013 | Kreupl et al. | |
| 8,772,754 B2 | 7/2014 | Kawai | |
| 9,412,789 B1 | 8/2016 | Herner | |
| 9,412,790 B1 | 8/2016 | Clark et al. | |
| 9,735,358 B2 | 8/2017 | Jo et al. | |
| 2005/0153514 A1 | 7/2005 | Lee et al. | |
| 2018/0277598 A1 | 9/2018 | Oda et al. | |
| 2022/0013722 A1* | 1/2022 | Jung ..................... H10B 63/24 |

FOREIGN PATENT DOCUMENTS

KR 100534210 B1 12/2005

* cited by examiner

*Primary Examiner* — Mark V Prenty
(74) *Attorney, Agent, or Firm* — Muir Patent Law, PLLC

(57) ABSTRACT

A variable resistance memory device includes first conductive lines extending in a first direction, second conductive lines extending in a second direction and crossing the first conductive lines in a plan view, and cell structures respectively provided at crossing points of the first conductive lines and the second conductive lines in the plan view. Each of the cell structures includes a switching pattern, a variable resistance pattern, and a first electrode provided between the switching pattern and the first conductive line, the first electrode including carbon. Each of the first conductive lines includes an upper pattern including a metal nitride in an upper portion thereof. The upper pattern is in contact with a bottom surface of the first electrode.

20 Claims, 20 Drawing Sheets

VARIABLE RESISTANCE MEMORY DEVICE AND METHOD OF MANUFACTURING THE SAME

CROSS-REFERENCE TO RELATED APPLICATION

This U.S. non-provisional patent application claims priority under 35 U.S.C. § 119 to Korean Patent Application No. 10-2020-0084795, filed on Jul. 9, 2020, in the Korean Intellectual Property Office, the disclosure of which is hereby incorporated by reference in its entirety.

BACKGROUND

Embodiments of the inventive concepts relate to a semiconductor device and, more particularly, to a variable resistance memory device and a method of manufacturing the same.

Semiconductor devices may be categorized as one of memory devices and logic devices. The memory devices may store logical data. Typically, semiconductor memory devices may be classified into volatile memory devices and non-volatile memory devices. The volatile memory devices may lose their stored data when their power supplies are interrupted. For example, the volatile memory devices may include dynamic random access memory (DRAM) devices and static random access memory (SRAM) devices. On the contrary, the non-volatile memory devices may retain their stored data even when their power supplies are interrupted. For example, the non-volatile memory devices may include programmable ROM (PROM), erasable PROM (EPROM), electrically EPROM (EEPROM), and a flash memory device.

SUMMARY

Embodiments of the inventive concepts may provide a variable resistance memory device capable of improving endurance by preventing a change in composition of a switching pattern, and a method of manufacturing the same.

In an aspect, a variable resistance memory device may include first conductive lines extending in a first direction, second conductive lines extending in a second direction and crossing the first conductive lines in a plan view, and cell structures respectively provided at crossing points of the first conductive lines and the second conductive lines in the plan view. Each of the cell structures may include a switching pattern, a variable resistance pattern, and a first electrode provided between the switching pattern and the first conductive line, the first electrode including carbon. Each of the first conductive lines may include an upper pattern including a metal nitride in an upper portion thereof. The upper pattern may be in contact with a bottom surface of the first electrode.

In an aspect, a variable resistance memory device may include first conductive lines extending in a first direction, second conductive lines extending in a second direction and crossing the first conductive lines in a plan view, and cell structures respectively provided at crossing points of the first conductive lines and the second conductive lines in the plan view. Each of the cell structures may include a switching pattern and a variable resistance pattern. Each of the first conductive lines may include first regions vertically overlapping the cell structures, and second regions disposed between the first regions. A nitrogen concentration of upper portions of the first regions may be higher than that of upper portions of the second regions.

In an aspect, a variable resistance memory device may include first conductive lines extending in a first direction, second conductive lines extending in a second direction and crossing the first conductive lines in a plan view, cell structures respectively provided at crossing points of the first conductive lines and the second conductive lines in the plan view, first filler structures interposed between the first conductive lines, a second filler structure interposed between the cell structures, and third filler structures interposed between the second conductive lines. Each of the cell structures may include a first electrode, a switching pattern on the first electrode, a second electrode on the switching pattern, a variable resistance pattern on the second electrode, and a third electrode on the variable resistance pattern. Each of the first conductive lines may include an upper pattern including a metal nitride in an upper portion thereof. The upper pattern may be in contact with a bottom surface of the first electrode.

In an aspect, a method of manufacturing a variable resistance memory device may include forming first conductive lines extending in a first direction, and forming cell structures on the first conductive lines. Each of the cell structures may include a switching pattern, a variable resistance pattern, and a first electrode provided between the switching pattern and the first conductive line, the first electrode including carbon. The forming of the first conductive lines may include performing a nitridation process on upper portions of the first conductive lines. The nitridation process may be performed before an etching process for forming the cell structures separated from each other.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
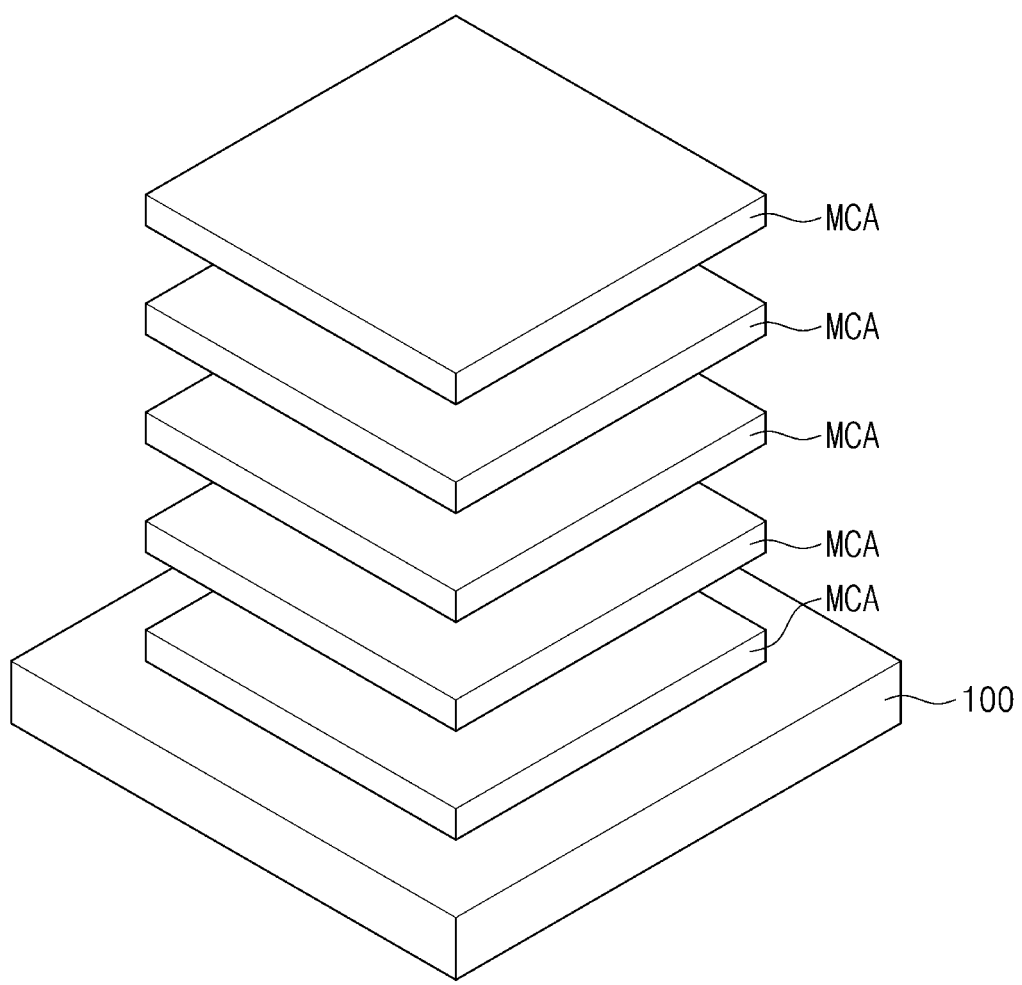
FIG. 1 is a conceptual view illustrating a variable resistance memory device according to some embodiments of the inventive concepts.

FIG. 1 is a conceptual view illustrating a variable resistance memory device according to some embodiments of the inventive concepts. Referring to FIG. 1, a variable resistance memory device according to some embodiments of the inventive concepts may include a plurality of memory cell stacks MCA sequentially stacked on a substrate 100. Each of the memory cell stacks MCA may include a plurality of variable resistance memory cells two-dimensionally arranged in a plane parallel with the top surface of each of the memory cell stacks MCA. The variable resistance memory device according to some embodiments of the inventive concepts may include conductive lines which are disposed between the memory cell stacks MCA and are used to write, read and erase the memory cells. FIG. 1 illustrates five memory cell stacks MCA. However, embodiments of the inventive concepts are not limited thereto.

Figure 2:
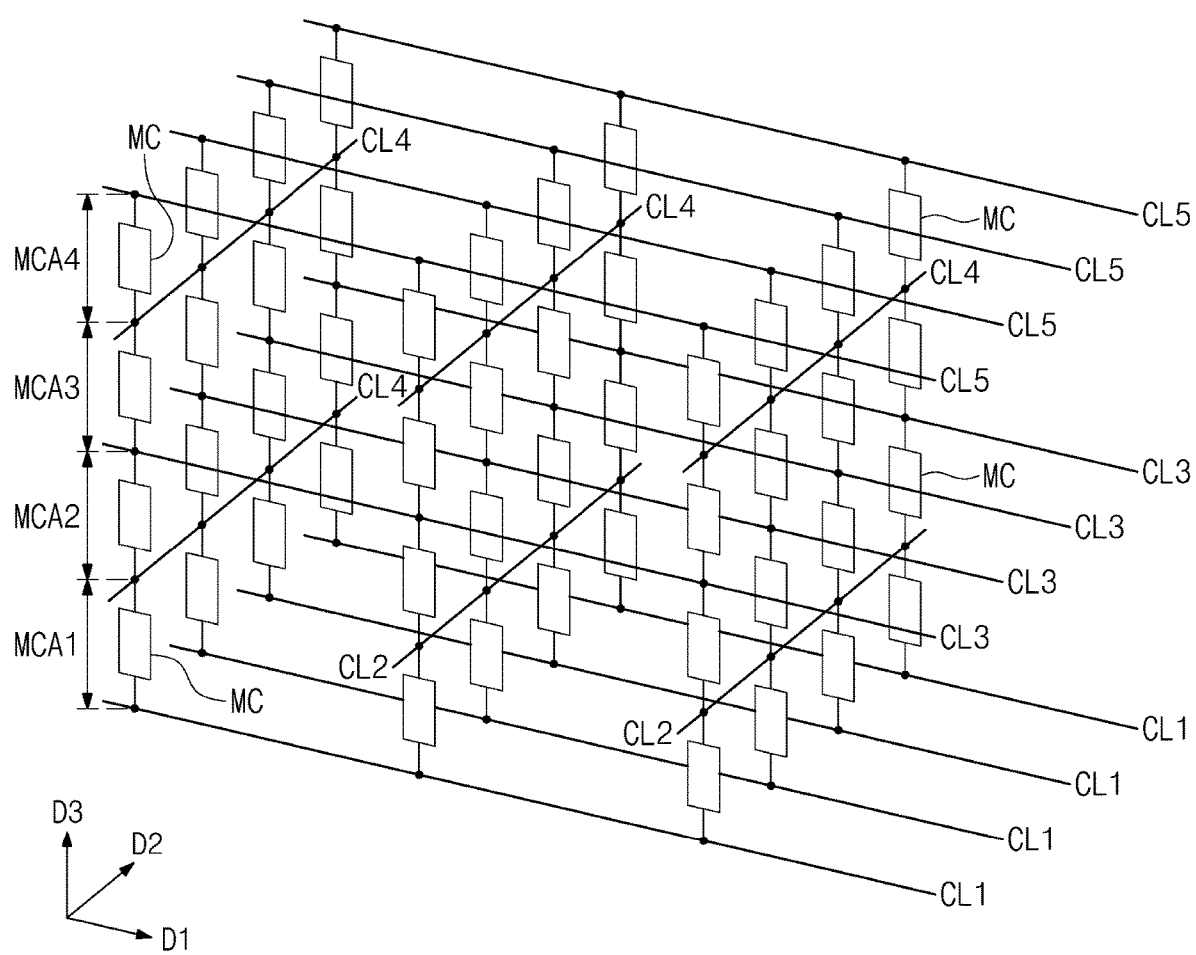
FIG. 2 is a circuit diagram illustrating memory cell stacks of FIG. 1.

FIG. 2 is a circuit diagram illustrating memory cell stacks of FIG. 1. First to fourth memory cell stacks MCA1 to MCA4 are illustrated in FIG. 2. Alternatively, five or more memory cell stacks may be provided in some embodiments, or three or less memory cell stacks may be provided in certain embodiments. For example, a variable resistance memory device according to some embodiments of the inventive concepts may include two memory cell stacks, i.e., a first memory cell stack MCA1 and a second memory cell stack MCA2. The first memory cell stack MCA1 may include cell structures MC respectively disposed at intersection points of first conductive lines CL1 and second conductive lines CL2. The second memory cell stack MCA2 may include cell structures MC respectively provided at intersection points of the second conductive lines CL2 and third conductive lines CL3, like the first memory cell stack MCA1. The second memory cell stack MCA2 may share the second conductive lines CL2 with the first memory cell stack MCA1. Alternatively, the second memory cell stack MCA2 may not share a conductive line with the first memory cell stack MCA1 in certain embodiments. Components of each of the third and fourth memory cell stacks MCA3 and MCA4 may be substantially the same as the components of the second memory cell stack MCA2. Embodiments including the third and fourth memory cell stacks MCA3 and MCA4 will be described later in detail with reference to FIG. 10.

Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The cell structures MC of the first memory cell stack MCA1 may be two-dimensionally arranged in an array form on a substrate to constitute rows and columns. Each of the cell structures MC may include a switching pattern and a variable resistance pattern. When the first conductive lines CL1 are provided between the substrate and the second conductive lines CL2, in each of the cell structures MC, the switching pattern may be provided between the substrate and the variable resistance pattern. Alternatively, the variable resistance pattern may be provided between the substrate and the switching pattern.

The switching pattern may be disposed at each of intersection points of the first conductive lines CL1 and the second conductive lines CL2 and may be physically separated from other switching patterns disposed at other intersection points adjacent thereto. The variable resistance pattern may be disposed at each of the intersection points of the first conductive lines CL1 and the second conductive lines CL2 and may be physically separated from other variable resistance patterns disposed at other intersection points adjacent thereto. Alternatively, one variable resistance pattern may be shared by a plurality of the cell structures MC. For example, the variable resistance pattern may have a line shape which extends in an extending direction of the first conductive lines CL1 or the second conductive lines CL2 in a plan view.

Figure 3:
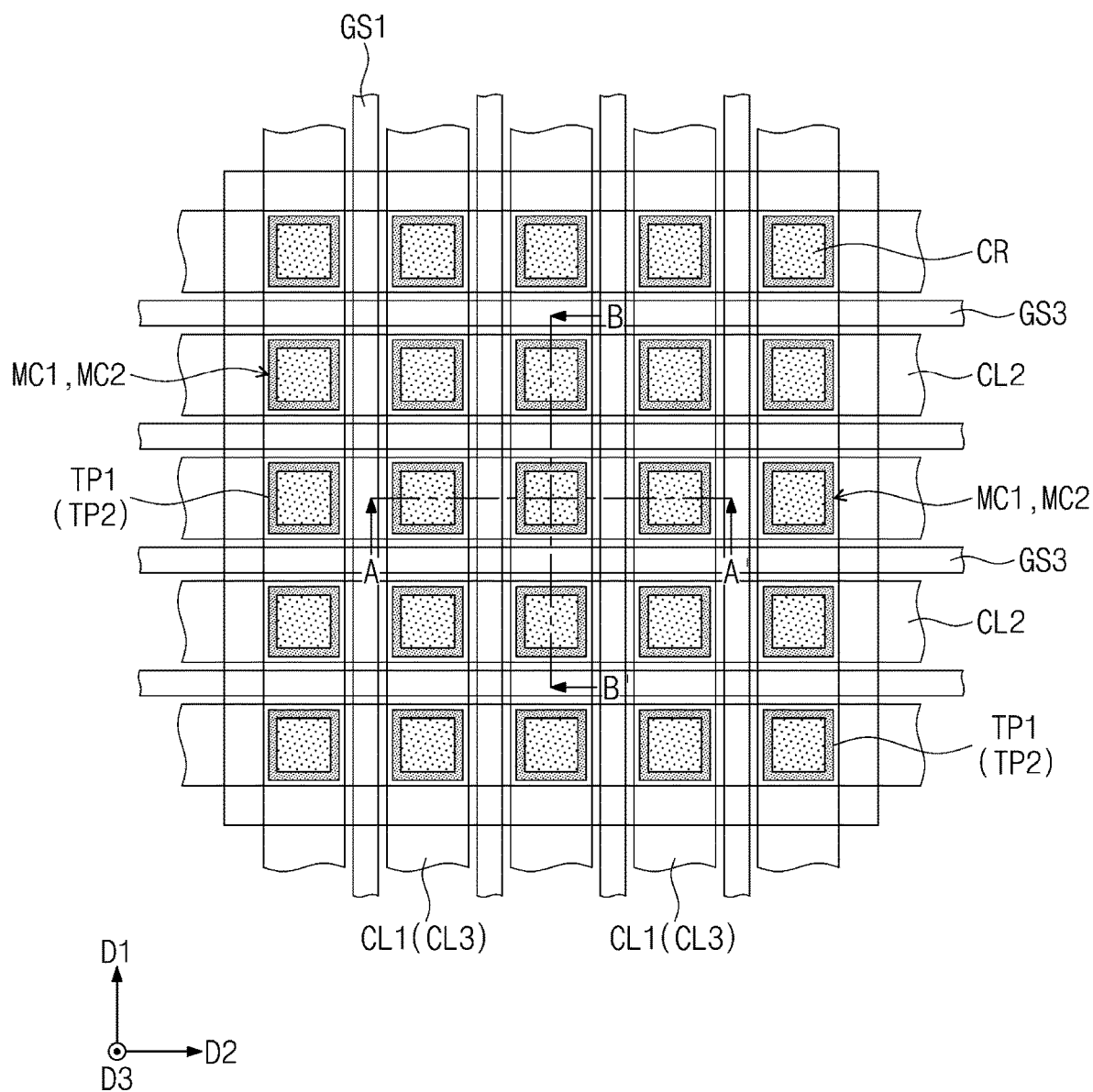
FIG. 3 is a plan view illustrating a variable resistance memory device according to some embodiments of the inventive concepts.
Figure 4:
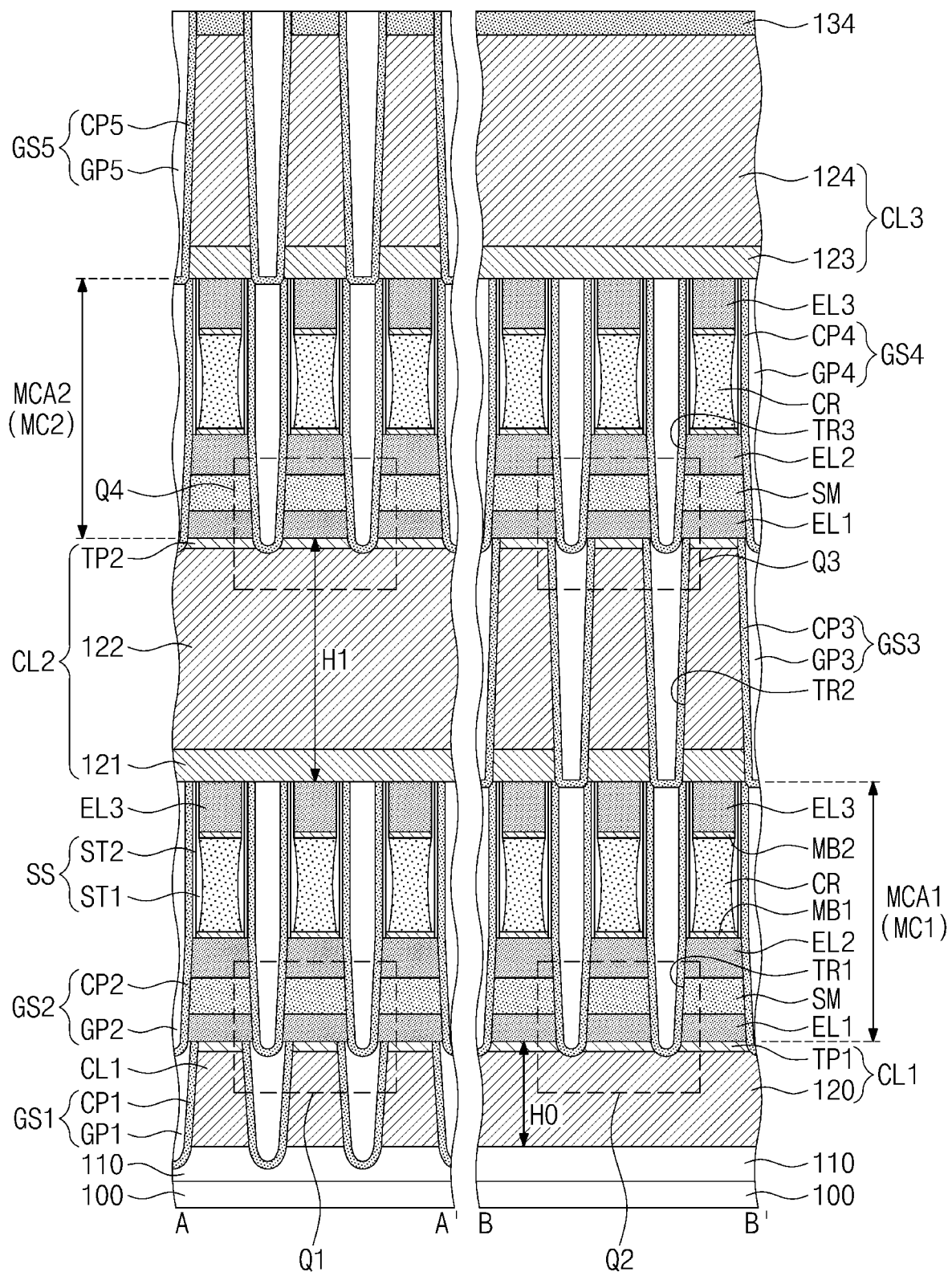
FIG. 4 is a cross-sectional view taken along lines A-A' and B-B' of FIG. 3.
Figure 5A:
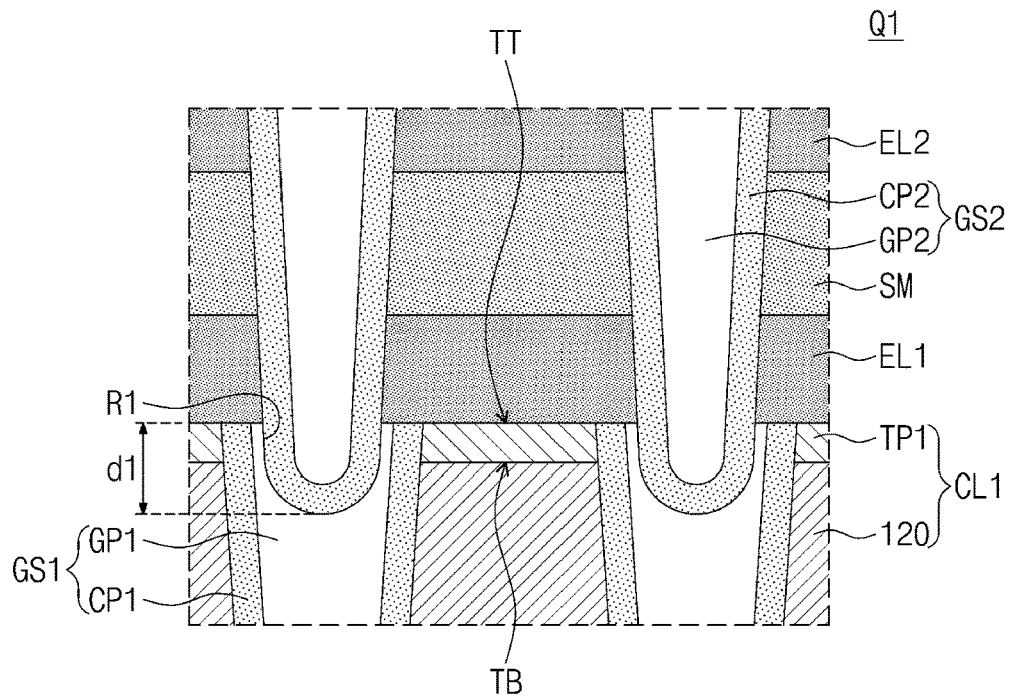
FIGS. 5A and 5B are enlarged views of regions 'Q1' and 'Q2' of FIG. 4, respectively.
Figure 5B:
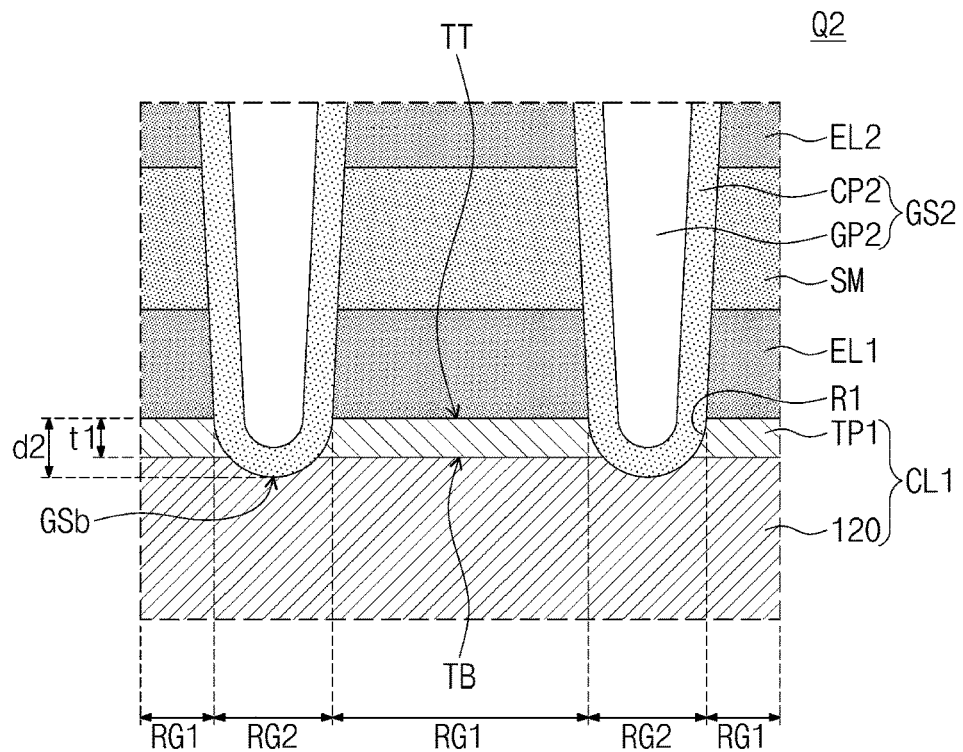
Figure 6:
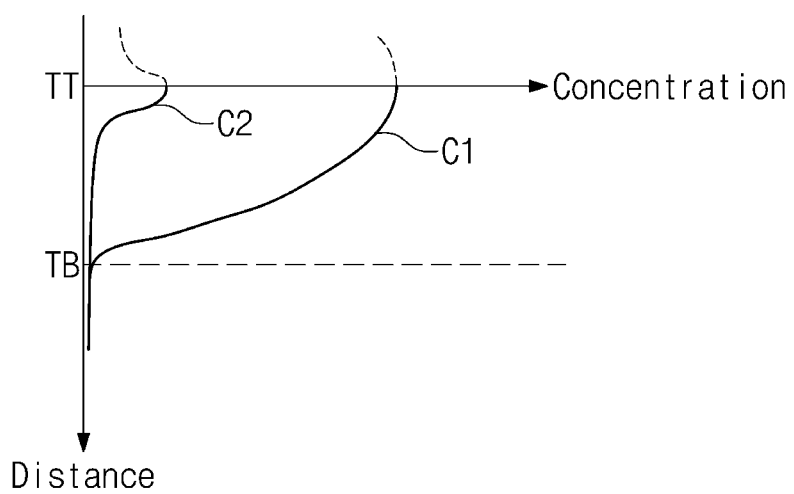
FIG. 6 is a graph showing a nitrogen concentration and an oxygen concentration of a conductive line.

FIG. 3 is a plan view illustrating a variable resistance memory device according to some embodiments of the inventive concepts. FIG. 4 is a cross-sectional view taken along lines A-A' and B-B' of FIG. 3. FIGS. 5A and 5B are enlarged views of regions 'Q1' and 'Q2' of FIG. 4, respectively. FIG. 6 is a graph showing a nitrogen concentration and an oxygen concentration of a conductive line. A variable resistance memory device including two memory cell stacks will be mainly described in embodiments of FIGS. 3 and 4. However, embodiments of the inventive concepts are not limited thereto. While FIGS. 5A and 5B will be described as the enlarged views of the regions 'Q1' and 'Q2' of FIG. 4 mainly, but may correspond to regions 'Q3' and 'Q4' of FIG. 4 respectively in certain embodiments.

Referring to FIGS. 3 to 5B, a variable resistance memory device may include a plurality of memory cell stacks MCA1 and MCA2 sequentially stacked on a substrate 100. For example, the memory cell stacks MCA1 and MCA2 may correspond to the memory cell stacks described with reference to FIGS. 1 and 2. A first memory cell stack MCA1 may be disposed between first conductive lines CL1 and second conductive lines CL2, which are provided on the substrate 100. The second conductive lines CL2 may be provided on/above the first conductive lines CL1. The first memory cell stack MCA1 may include first cell structures MC1 which are provided at intersection points of the first conductive lines CL1 and the second conductive lines CL2, respectively. A second memory cell stack MCA2 may be disposed between the second conductive lines CL2 and third conductive lines CL3 provided on/above the second conductive lines CL2. The second memory cell stack MCA2 may include second cell structures MC2 which are provided at intersection points of the second conductive lines CL2 and the third conductive lines CL3, respectively. The first and second cell structures MC1 and MC2 have quadrilateral (or square) shapes in FIG. 3. However, embodiments of the inventive concepts are not limited thereto. In certain embodiments, the first and second cell structures MC1 and MC2 may have rounded shapes and/or circular shapes.

The first conductive lines CL1 may extend in a first direction D1 substantially parallel to a top surface of the substrate 100, and the second conductive lines CL2 may extend in a second direction D2 which intersects the first direction D1 and is substantially parallel to the top surface of the substrate 100. For example, the second direction D2 may be perpendicular to the first direction D1. The third conductive lines CL3 may extend in the first direction D1 and may be substantially parallel to the first conductive lines CL1.

A thickness H0 of the first conductive lines CL1 in a third direction D3 perpendicular to the top surface of the substrate 100 may be less than a thickness H1 of the second conductive lines CL2 in the third direction D3. For example, the thickness H0 of the first conductive lines CL1 may be equal to or less than a half of the thickness H1 of the second conductive lines CL2. For example, the thickness H1 of the second conductive lines CL2 may range from about 700 Å to about 1100 Å. The thickness H0 of the first conductive lines CL1 may range from about 300 Å to about 500 Å. A width of each of the first conductive lines CL1 in the second direction D2 may become less (e.g., decrease) from its bottom surface toward its top surface (e.g., in a direction moving from the bottom to the top). Descriptions to the second conductive lines CL2 may also be applied to the third conductive lines CL3 and other conductive lines to be described below. A gradient (or slope) of sidewalls of the first conductive lines CL1 may be less than a gradient (or slope) of sidewalls of the second conductive lines CL2. For example, side surfaces of the second conductive lines CL2 may be steeper than side surfaces of the first conductive lines CL1 with respect to a horizontal plane parallel to a top surface of the substrate 100.

Each of the first conductive lines CL1 may include first regions RG1 and second regions RG2 which extend in the first direction D1 and are alternately arranged in the first direction D1 (see FIG. 5B). The first regions RG1 may be disposed under the first cell structures MC1, and the second regions RG2 may be disposed between the first cell structures MC1 in a plan view. In some embodiments, as illustrated in FIG. 5B, top surfaces of the second regions RG2 may be lower than top surfaces of the first regions RG1. The second regions RG2 may be regions recessed from the top surfaces of the first regions RG1 by first recess regions R1. Each of top surfaces of the second regions RG2 may be connected to and/or may contact a bottom surface GSb of a second filling structure GS2 which will be described later/below, and the top surfaces of the first regions RG1 may be connected to and/or may contact bottom surfaces of first electrodes EL1 of the first cell structures MC1, respectively.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Each of the first conductive lines CL1 may include a lower pattern 120 and an upper pattern TP1. In some embodiments, a plurality of the upper patterns TP1 may be disposed in upper portions of the first regions RG1, respectively. In the embodiments of FIG. 5B, the upper patterns TP1 of each of the first conductive lines CL1 may be spaced apart from each other in the first direction D1 on the lower pattern 120. The upper patterns TP1 may not be disposed in the second regions RG2. Each of the upper patterns TP1 may include a top surface TT and a bottom surface TB. A thickness t1 of the upper pattern TP1 may range from about 5% to about 50% of the thickness H0 of the first conductive line CL1. For example, the thickness t1 of the upper pattern TP1 may range from about 5 Å to about 40 Å. In certain embodiments, the thickness t1 of the upper pattern TP1 may range from about 15 Å to about 150 Å.

The lower pattern 120 may include a metal material such as tungsten, titanium, ruthenium, or tantalum. The upper pattern TP1 may include a metal nitride such as tungsten nitride, titanium nitride, ruthenium nitride, or tantalum nitride. In some embodiments, the upper pattern TP1 may include a nitride of the same kind of a metal as a metal element included in the lower pattern 120. For example, the lower pattern 120 may include tungsten, and the upper pattern TP1 may include tungsten nitride.

A nitrogen concentration of the upper pattern TP1 may range from about 5 at % to about 50 at %. The nitrogen concentration of the upper pattern TP1 may not be constant or uniform in the third direction D3. Referring to FIG. 6, a nitrogen concentration C1 of the first conductive line CL1 may become less (e.g., decrease) from the top surface TT of the upper pattern TP1 toward a bottom surface of the first conductive line CL1. For example, the nitrogen concentration C1 may become continuously less (e.g., gradually decrease) from the top surface TT toward the bottom surface TB of the upper pattern TP1. For example, the nitrogen concentration C1 of the first conductive line CL1 may gradually increase approaching the top surface of the first conductive line CL1 in the third direction D3. The nitrogen concentration C1 may converge to zero (0) near the bottom surface TB of the upper pattern TP1. For example, a lower portion of the first conductive line CL1 may substantially not include a nitrogen element. In the present specification, it may be understood that when a component substantially does not include a specific element, it may include the specific element of 1 at % or less as unintentional impurities.

Oxygen in the first conductive line CL1 may be due to natural oxidation and may have a concentration of 1 at % or less. An oxygen concentration C2 of the first conductive line CL1 may have a peak at the top surface TT of the upper pattern TP1 and may decrease rapidly and then converge to zero (0) as a distance from the top surface TT increases as shown in FIG. 6.

An interlayer insulating layer 110 may be provided between the substrate 100 and the first conductive lines CL1. For example, the interlayer insulating layer 110 may include at least one of silicon oxide, silicon nitride, or silicon oxynitride. First filling structures GS1 may fill spaces between the first conductive lines CL1 and may extend in the first direction D1 along the first conductive lines CL1. For example, the filling structures GS1 may be interposed between the first conductive lines CL1. Each of the first filling structures GS1 may have a bar or line shape extending in the first direction D1 when viewed in a plan view. Each of the first filling structures GS1 may include a first capping pattern CP1 and a first filling pattern GP1. For example, filling structures in the present disclosure may be filler patterns. For example, first filling structures, second filling structures, etc. may be respectively called as first filler patterns, second filler patterns, etc. In some embodiments, the first capping pattern CP1 may conformally cover sidewalls/side surfaces of the first conductive lines CL1. The first filling structures GS1 may extend into an upper portion of the interlayer insulating layer 110, e.g., downward in the third direction D3. For example, lower portions of the first filling structures GS1 may be inserted in the upper portion of the interlayer insulating layer 110. The first capping pattern CP1 may include or may be formed of at least one of SiN, SiO$_2$, SiON, SiBN, SiCN, SiOCN, Al$_2$O$_3$, AlN, and/or AlON. The first filling pattern GP1 may include or may be formed of at least one of SiN, SiON, SiC, SiCN, SiOC, SiOCN, SiO$_2$, and/or Al$_2$O$_3$.

Upper portions of the first filling structures GS1 may have substantially the same nitrogen concentration profile as the upper portion of the first conductive line CL1. For example, a nitrogen concentration of each of the first filling structures GS1 may become continuously less (e.g., gradually decrease) from the same level as the top surface TT of the upper pattern TP1 toward the same level as the bottom surface TB of the upper pattern TP1. For example, each of the first capping pattern CP1 and the first filling pattern GP1 may have substantially the same nitrogen concentration as the upper pattern TP1.

Each of the first cell structures MC1 may include a switching pattern SM and a variable resistance pattern CR on the switching pattern SM. First electrodes EL1 may be provided between the switching patterns SM and the first conductive lines CL1. Lower electrode patterns MB1 may be provided between the switching patterns SM and the variable resistance patterns CR. Second electrodes EL2 may be provided between the switching patterns SM and the lower electrode patterns MB1. Third electrodes EL3 may be provided between the variable resistance patterns CR and the second conductive lines CL2. Upper electrode patterns MB2 may be provided between the third electrodes EL3 and the variable resistance patterns CR. For example, each of the first cell structures MC1 may include a first electrode ELL a switching pattern SM, a second electrode EL2, a lower electrode pattern MB1, a variable resistance pattern CR, an upper electrode pattern MB2 and a third electrode EL3, which are sequentially stacked, e.g., upwardly on a first conductive line CL1. Hereinafter, the first cell structures MC1 will be mainly described. However, the second cell structures MC2 and other cell structures may have the same structure as the first cell structures MC1.

In the following descriptions, the switching patterns SM are disposed between the first electrodes EL1 and the second electrodes EL2, and the variable resistance patterns CR are disposed between the second electrodes EL2 and the third electrodes EL3. Alternatively, the variable resistance patterns CR may be disposed between the first electrodes EL1 and the second electrodes EL2, and the switching patterns SM may be disposed between the second electrodes EL2 and the third electrodes EL3 in certain embodiments.

A width of the top surface TT of each of the upper patterns TP1 may be less than a width of a bottom surface of the switching pattern SM disposed thereon. When the variable resistance patterns CR are disposed between the first electrodes EL1 and the second electrodes EL2 as described above, the width of the top surface TT of each of the upper patterns TP1 may be less than a width of a bottom surface of the variable resistance pattern CR disposed thereon. The variable resistance patterns CR may be formed of at least one of materials having properties capable of storing data. When the variable resistance memory device according to some embodiments of the inventive concepts is a phase change memory device, the variable resistance patterns CR may include a material of which a phase is reversibly changeable between a crystalline phase and an amorphous phase by a temperature. For example, a phase transition temperature between the crystalline and amorphous phases of the variable resistance patterns CR may range from about 250 degrees Celsius to about 350 degrees Celsius. The variable resistance patterns CR may be formed of a compound that includes at least one of Te, Se or S (i.e., chalcogenide elements) and at least one of Ge, Sb, Bi, Pb, Sn, Ag, As, Si, In, Ti, Ga, P, O, or C. For example, the variable resistance patterns CR may include or may be formed of at least one of a binary compound (e.g., GeTe, GeSe, GeS, Sb Se, SbTe, SbS, SnSb, InSe, InSb, AsTe, AlTe, GaSb, AlSb, BiSb, ScSb, Ysb, CeSb, DySb, or NdSb), a ternary compound (e.g., GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, or NdSbS), a quaternary compound (e.g., GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, or NdGeSbS), or a quinary compound (e.g., InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSb SeGaAl, GeSb SeGaTl, GeSb SeGaZn, GeSb SeGaSn, GeSb SeAlTl, GeSb SeAlZn, GeSbSeAlSn, GeSbSeTlZn, GeSbSeTlSn, or GeSbSeZnSn). Each of the variable resistance patterns CR may be formed of a single layer, e.g., including one of the materials or may be formed of a plurality of layers, e.g., including different ones of the materials. In certain embodiments, the variable resistance patterns CR may have a superlattice structure in which layers including Ge and layers not including Ge are repeatedly and alternately stacked. For example, the variable resistance patterns CR may have a structure in which GeTe layers and Sb$_2$Te$_3$ layers are alternately and repeatedly stacked, or a structure in which GeTe layers and Bi$_2$Te$_3$ layers are alternately and repeatedly stacked. In certain embodiments, the variable resistance patterns CR may further include at least one of B, C, N, O, P, Cd, W, Ti, Hf, or Zr, in addition to at least one of the materials described above as examples.

The variable resistance patterns CR may have recess portions on their sidewalls/side surfaces. The recess portion may be a region in which the sidewall of the variable resistance pattern CR is recessed from a sidewall of the lower electrode pattern MB1 and a sidewall of the upper electrode pattern MB2. For example, the variable resistance pattern CR may have a width at a middle portion less than widths at a lower portion and at a higher portion than the middle portion.

Each of the switching patterns SM may include an ovonic threshold switch (OTS) element having a bi-directional characteristic. For example, each of the switching patterns SM may be an element based on a threshold switching phenomenon having a nonlinear I-V curve (e.g., a S-shaped I-V curve). The switching patterns SM may have a phase transition temperature between crystalline and amorphous phases, which is higher than that of the variable resistance patterns CR. For example, the phase transition temperature of the switching patterns SM may range from about 350 degrees Celsius to about 450 degrees Celsius. Thus, when the variable resistance memory device according to the embodiments of the inventive concepts is operated, the phases of the variable resistance patterns CR may be reversibly changed between the crystalline and amorphous phases by an operating voltage (e.g., a program voltage), but the switching patterns SM may be maintained in a substantially amorphous state without a phase change even though the operating voltage is applied thereto. In the present specification, the term 'substantially amorphous state' may include an amorphous state and may also include a case in which a grain boundary or a crystallized portion locally exists in a portion of a component. For example, the locally crystallized portion may be relatively small in the substantially amorphous state.

The switching patterns SM may be formed of a compound that includes at least one of Te, Se or S (i.e., chalcogenide elements) and at least one of Ge, Sb, Bi, Al, Pb, Sn, Ag, As, Si, In, Ti, Ga, or P. For example, the switching patterns SM may include at least one of a binary compound (e.g., GeSe, GeS, AsSe, AsTe, as SiTe, SiSe, SiS, GeAs, SiAs, SnSe, or SnTe), a ternary compound (e.g., GeAsTe, GeAsSe, AlAsTe, AlAsSe, SiAsSe, SiAsTe, GeSeTe, GeSeSb, GaAsSe, GaAsTe, InAsSe, InAsTe, SnAsSe, or SnAsTe), a quaternary compound (e.g., GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, or GeAsTeZn), a quinary compound (e.g., GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, or GeAsSeZnSn), or a senary compound (e.g., GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeS- InGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, or GeAsSeSAlSn).

Each of the switching patterns SM may be formed of a single layer, e.g., including one of the materials or may be formed of a plurality of layers, e.g., including different ones of the materials. In certain embodiments, the switching patterns SM may further include at least one of B, C, N, or O, in addition to at least one of the materials described above as examples.

The first to third electrodes EL1, EL2 and EL3 may include a conductive material. For example, the first to third electrodes EL1, EL2 and EL3 may be carbon electrodes including carbon. In certain embodiments, the first to third electrodes EL1, EL2 and EL3 may include or may be formed of a metal and/or a metal nitride. A width of each of the first electrodes EL1 in the first direction D1 or in the second direction D2 may be substantially equal to or greater than a width of the first conductive line CL1 provided thereunder in the same direction.

The lower electrode patterns MB1 and the upper electrode patterns MB2 may cover bottom surfaces and top surfaces of the variable resistance patterns CR to prevent diffusion of the material of the variable resistance patterns CR, e.g., to the second and third electrodes EL2 and EL3. In addition, the lower electrode patterns MB1 may be provided between the variable resistance patterns CR and the switching patterns SM to reduce a contact resistance. The lower and upper electrode patterns MB1 and MB2 may include or may be formed of at least one of W, Ti, Al, Cu, C, CN, TiN, TiAlN, TiSiN, TiCN, WN, CoSiN, WSiN, TaN, TaCN, or TaSiN.

The first cell structures MC1 may include spacer structures SS. Each of the spacer structures SS may cover and/or contact sidewalls of the lower electrode pattern MB1, the upper electrode pattern MB2, the variable resistance pattern CR and the third electrode EL3. Bottom surfaces of the spacer structures SS may be in contact with top surfaces of the second electrodes EL2. The spacer structures SS may include or may be formed of at least one of silicon oxide, silicon nitride, or silicon oxynitride. For example, each of the spacer structures SS may include a first spacer ST1 and a second spacer ST2 which include different materials from each other. The first spacers ST1 may fill the recess portions of the variable resistance patterns CR. The second spacers ST2 may cover sidewalls of the first spacers ST1. For example, the first spacers ST1 may contact side surfaces of the variable resistance patterns CR, and may be disposed between the variable resistance patterns CR and the second spacers ST2.

The first cell structures MC1 may be two-dimensionally arranged in the first direction D1 and the second direction D2 and may be spaced apart from each other. The first cell structures MC1 may be spaced apart from each other by a first trench TR1, and the first trench TR1 may have a lattice or mesh shape extending in the first direction D1 and the second direction D2.

A second filling structure GS2 may be provided to fill the first trench TR1 between the first cell structures MC1. The second filling structure GS2 may have a lattice or mesh shape which includes portions extending in the first direction D1 and portions extending in the second direction D2, e.g., when viewed in a plan view. The second filling structure GS2 may include a second capping pattern CP2 and a second filling pattern GP2. For example, the second capping pattern CP2 may conformally cover sidewalls/side surfaces of the first cell structures MC1. Lower portions of the second capping pattern CP2 may be inserted in upper portions of the first filling structures GS1. For example, bottom surfaces of the second filling structure GS2 may be at a lower level than top surfaces of the first filling structures GS1 in the third direction D3. The second filling pattern GP2 may be provided on the second capping pattern CP2. The second filling pattern GP2 may be spaced apart from the first cell structures MC1 with the second capping pattern CP2 interposed therebetween.

A bottom surface GSb of the second filling structure GS2 may be in contact with top surfaces of the first filling structures GS1 and the first conductive lines CL1. For example, the bottom surface GSb of the second filling structure GS2 connected to/in contact with the upper portion of the first conductive line CL1 may extend downwards to a second depth d2 from the top surface of the first conductive line CL1, and the bottom surface GSb of the second filling structure GS2 connected to/in contact with the upper portion of the first filling structure GS1 may extend downwards to a first depth d1 greater than the second depth d2 from the top surface of the first conductive line CL1 and/or from the top surface of the first filling structure GS1. The aforementioned materials of the first capping pattern CP1 and the first filling pattern GP1 may also be applied to the second capping pattern CP2 and the second filling pattern GP2, respectively.

Each of the second conductive lines CL2 may include a barrier pattern 121, a lower pattern 122, and an upper pattern TP2. Except for different features described hereinafter, other features of the lower pattern 122 and the upper pattern TP2 of the second conductive line CL2 may be substantially the same as corresponding features of the lower pattern 120 and the upper pattern TP1 of the first conductive line CL1. In addition, the descriptions to the regions 'Q1' and 'Q2' of FIGS. 5A and 5B (or FIGS. 7A and 7B or FIGS. 8A and 8B to be described later) and the graph of the nitrogen and oxygen concentrations of FIG. 6 may also be applied to the regions 'Q3' and 'Q4' of FIG. 4. For example, a nitrogen concentration of the second conductive line CL2 may become less from a top surface toward a bottom surface of the upper pattern TP2. For example, the nitrogen concentration of the second conductive line CL2 may gradually decrease moving downwards from the top surface of the upper pattern TP2. For example, an oxygen concentration of the second conductive line CL2 may have a peak at the top surface of the upper pattern TP2 and may decrease rapidly and then converge to zero (0) as a distance from the top surface of the upper pattern TP2 increases. The first conductive lines CL1 do not include barrier patterns in FIG. 4. However, in certain embodiments, the first conductive lines CL1 may include barrier patterns, e.g., under the lower pattern 120 as similarly shown with respect to the second conductive lines CL2.

The barrier pattern 121 may include a metal nitride such as tungsten nitride, titanium nitride, ruthenium nitride, or tantalum nitride. A thickness of the barrier pattern 121 may range from about 1/20 to about 1/7 of a thickness of the lower pattern 122. The barrier pattern 121 may increase adhesive strength with the third electrodes EL3 of the first cell structures MC1. The upper pattern TP2 may be thinner than the barrier pattern 121. For example, a thickness of the upper pattern TP2 may range from about 1/15 to about 1/5 of the thickness of the barrier pattern 121. The barrier pattern 121 may have a substantially constant nitrogen concentration in a thickness direction, unlike the upper pattern TP2. For example, the barrier pattern 121 may include a portion adjacent to the top surface and a portion adjacent to the bottom surface, which has substantially the same nitrogen concentration. For example, the barrier pattern 121 may have a substantially constant nitrogen concentration throughout the barrier pattern 121. The upper pattern TP2 may not have a peak of the oxygen concentration at a portion being in contact with the lower pattern 122, but the barrier pattern 121 may have a peak of the oxygen concentration at a portion being in contact with the lower pattern 122. For example, the oxygen concentration of the barrier pattern 121 may be gradually decrease moving downwards from its top surface to its bottom surface.

Third filling structures GS3 may be provided to fill second trenches TR2 between the second conductive lines CL2. The second trenches TR2 may extend in the second direction D2 and may be spaced apart from each other in the first direction D1. Each of the third filling structures GS3 may have a bar or line shape extending in the second direction D2. For example, the third filling structures GS3 may be separated from each other with the second conductive lines CL2 interposed therebetween. For example, the third filling structures GS3 and the second conductive lines CL2 may be alternately disposed in the first direction D1. Each of the third filling structures GS3 may include a third capping pattern CP3 and a third filling pattern GP3. The third capping pattern CP3 may cover sidewalls/side surfaces of a pair of the second conductive lines CL2 adjacent to each other and may cover a top surface of the second filling structure GS2 exposed between the pair of second conductive lines CL2. For example, a bottom surface of the third capping pattern CP3 may be in contact with the second capping pattern CP2 and the second filling pattern GP2. The third capping pattern CP3 may not be in contact with top surfaces of the first cell structures MC1 (e.g., top surfaces of the third electrodes EL3). However, embodiments of the inventive concepts are not limited thereto. Each of the third capping pattern CP3 and the third filling pattern GP3 may extend in the second direction D2. The aforementioned materials of the first capping pattern CP1 and the first filling pattern GP1 may also be applied to the third capping pattern CP3 and the third filling pattern GP3, respectively.

A fourth filling structure GS4 may be provided to fill a third trench TR3 formed between the second cell structures MC2. The fourth filling structure GS4 may include a fourth capping pattern CP4 and a fourth filling pattern GP4. Descriptions to the fourth filling structure GS4 may be substantially the same as the descriptions to the second filling structure GS2. A bottom surface of the fourth capping pattern CP4 may be in contact with top surfaces of the third filling structures GS3 and top surfaces of the second conductive lines CL2.

Portions of the fourth capping pattern CP4, which are connected to or contact the top surfaces of the third filling structures GS3, may extend downwards to a level lower than the top surfaces of the second conductive lines CL2. The upper patterns TP2 may be spaced apart from each other with lower portions of the fourth capping pattern CP4 interposed therebetween.

The third conductive lines CL3 may extend in the first direction D1, and each of the third conductive lines CL3 may include a barrier pattern 123 and a lower pattern 124. The third conductive lines CL3 may not include upper patterns corresponding to the upper patterns TP1 or TP2 of the first and second conductive lines CL1 and CL2, unlike the first and second conductive lines CL1 and CL2. However, in certain embodiments, the third conductive lines CL3 may include upper patterns. For example, when a memory cell stack is stacked on the third conductive lines CL3 like a structure to be described later with reference to FIG. 10, the third conductive lines CL3 may include the upper patterns. Other features of the third conductive lines CL3 may be substantially the same as corresponding features of the second conductive lines CL2. An upper mask pattern 134 may remain on the third conductive lines CL3. Alternatively, the upper mask pattern 134 may not remain on the third conductive lines CL3. For example, when a memory cell stack is stacked on the third conductive lines CL3 like the structure to be described later with reference to FIG. 10, the upper mask pattern 134 may be removed from top surfaces of the third conductive lines CL3. For example, the mask pattern 134 may be used as an etching mask to form the third conductive lines CL3 in an etching process.

Fifth filling structures GS5 may be provided to fill spaces between the third conductive lines CL3. Each of the fifth filling structures GS5 may include a fifth capping pattern CP5 and a fifth filling pattern GP5. The aforementioned materials of the first capping pattern CP1 and the first filling pattern GP1 may also be applied to the fifth capping pattern CP5 and the fifth filling pattern GP5, respectively. A non-solid region such as an air gap, a seam or a void does not exist in each of the first to fifth filling structures GS1 to GS5 of the above described embodiments. However, in certain embodiments, each of the first to fifth filling structures GS1 to GS5 may include the non-solid region therein, e.g., together with the above described solid filling structures GS1 to GS5 or instead of the above described filling structures GS1 to CSS. For example, the air gap may be a gap filled with air or filled with a gas.

Figure 7A:
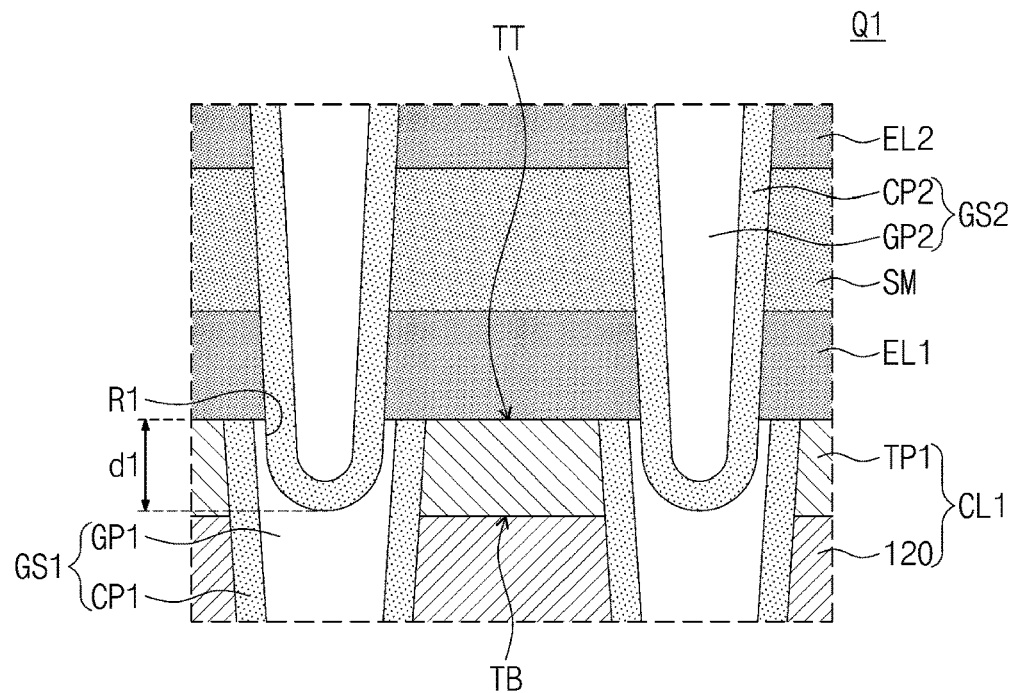
FIGS. 7A and 7B are enlarged views of the regions 'Q1' and 'Q2' of FIG. 4, respectively, to illustrate a variable resistance memory device according to some embodiments of the inventive concepts.
Figure 7B:
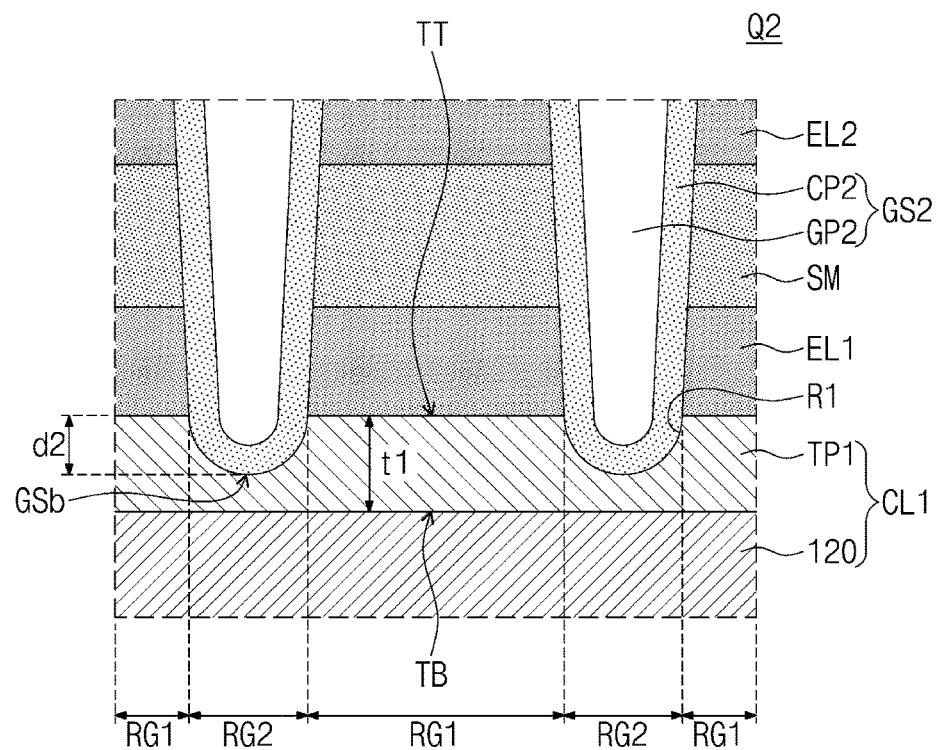

FIGS. 7A and 7B are enlarged views of the regions 'Q1' and 'Q2' of FIG. 4, respectively, to illustrate a variable resistance memory device according to some embodiments of the inventive concepts. Hereinafter, the descriptions to the same components as in the above embodiments will be omitted for the purpose of ease and convenience in explanation.

Referring to FIGS. 7A and 7B, each of upper patterns TP1 may extend in the first direction D1 and may be in common contact with the first electrodes EL1 of the first cell structures MC1. For example, each of the upper patterns TP1 may contact a plurality of the first electrodes EL1 of the first cell structures MC1. For example, the upper pattern TP1 may not be divided into segments in the first direction D1, unlike the embodiments of FIG. 5B. The upper pattern TP1 may include a plurality of first recess regions R1 recessed toward the substrate 100 from its top surface TT, and lower portions of the second filling structure GS2 may extend downwards into the first recess regions R1. Bottom surfaces GSb of the second filling structure GS2 may be disposed at a level between the top surface TT and the bottom surface TB of the upper pattern TP1 in the third direction D3.

Figure 8A:
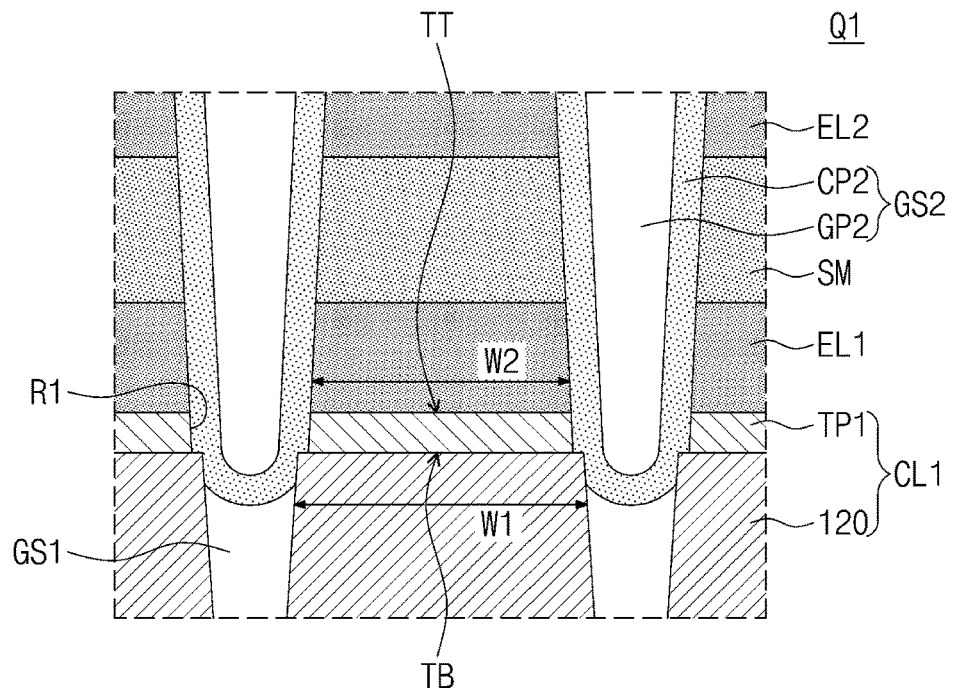
FIG. 8A is an enlarged view of the region 'Q1' of FIG. 4 to illustrate a variable resistance memory device according to some embodiments of the inventive concepts.

FIG. 8A is an enlarged view of the region 'Q1' of FIG. 4 to illustrate a variable resistance memory device according to some embodiments of the inventive concepts. In the present embodiments, a lower width W2 of each of first electrodes EL1 may be less than an upper width W1 of a lower pattern 120 of a first conductive line CL1 provided thereunder. Sidewalls/side surfaces of upper patterns TP1 of the first conductive lines CL1 may be aligned with sidewalls/side surfaces of the first electrodes ELL For example, a stepped structure may be provided between the lower pattern 120 and the upper pattern TP1. In certain embodiments, the side surfaces of the lower pattern 120 may also be aligned with the first electrodes EL1 while still the lower width W2 of the first electrode EL1 is less than the upper width W1 of the lower pattern 120 in which the widths of the first cell structures MC1 and the first conductive lines CL1 are gradually increase downwards in the third direction D3.

Figure 8B:
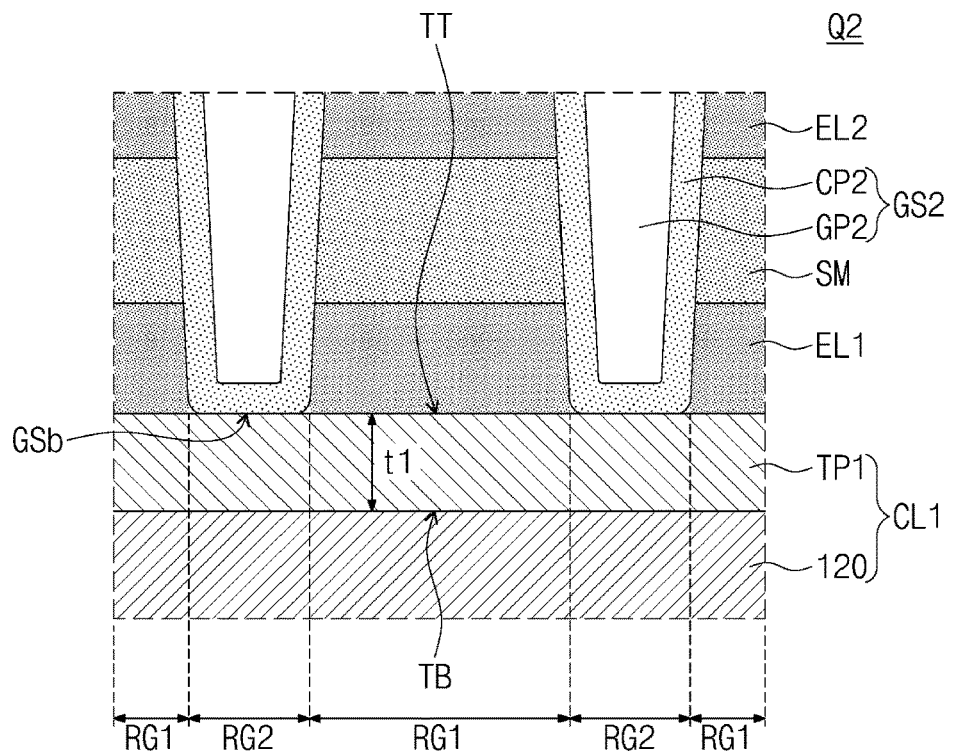
FIG. 8B is an enlarged view of the region 'Q2' of FIG. 4 to illustrate a variable resistance memory device according to some embodiments of the inventive concepts.

FIG. 8B is an enlarged view of the region 'Q2' of FIG. 4 to illustrate a variable resistance memory device according to some embodiments of the inventive concepts. Each of upper patterns TP1 may extend in the first direction D1 and may be in common contact with the first electrodes EL1 of the first cell structures MC1. For example, each of the upper patterns TP1 may contact a plurality of the first electrodes EL1 of the first cell structures MC1. In the present embodiments, bottom surfaces GSb of the second filling structure GS2 may be located at substantially the same level as the top surface TT of the upper pattern TP1.

A width of the top surface TT of each of the upper patterns TP1 may be equal to or greater than a width of a bottom surface of the switching pattern SM disposed thereon. When the variable resistance patterns CR are disposed between the first electrodes EL1 and the second electrodes EL2 as described above, the width of the top surface TT of each of the upper patterns TP1 may be equal to or greater than a width of a bottom surface of the variable resistance pattern CR disposed thereon.

Figure 9:
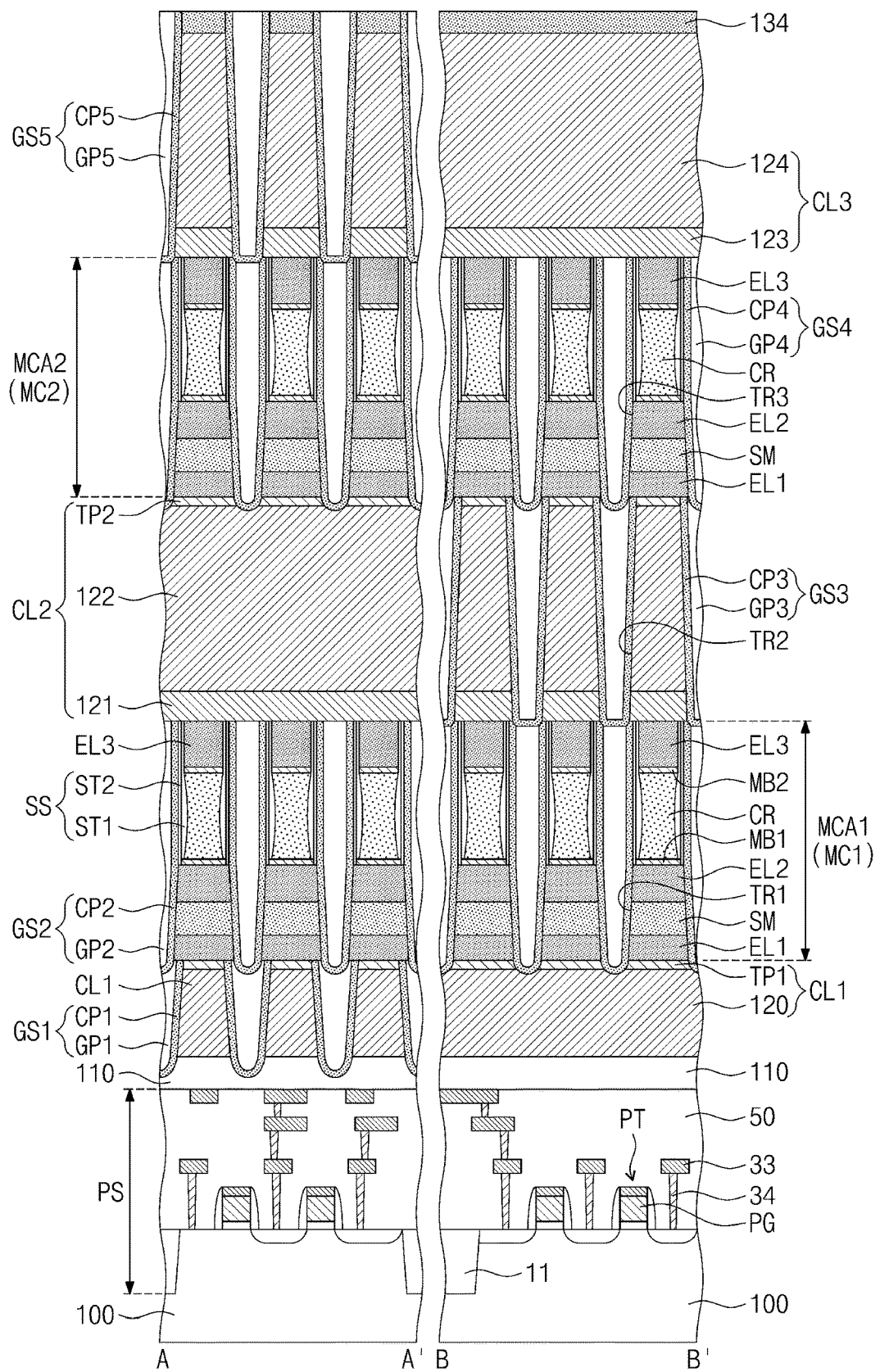
FIG. 9 is a cross-sectional view taken along the lines A-A' and B-B' of FIG. 3 to illustrate a variable resistance memory device according to some embodiments of the inventive concepts.

FIG. 9 is a cross-sectional view taken along the lines A-A' and B-B' of FIG. 3 to illustrate a variable resistance memory device according to some embodiments of the inventive concepts. In the present embodiments, a peripheral circuit region PS may be provided under a cell array region including a plurality of memory cell stacks. For example, the peripheral circuit region PS may be provided between a first memory cell stack MCA1 and a substrate 100. The peripheral circuit region PS may include peripheral logic circuits. For example, the peripheral circuit region PS may include row and column decoders, a page buffer, and a control circuit. The peripheral circuit region PS may include NMOS and PMOS transistors, low-voltage and high-voltage transistors and a resistor, which are integrated on the substrate 100. For example, peripheral transistors PT may be disposed in the peripheral circuit region PS. The peripheral transistors PT may include active regions defined by a device isolation layer 11 formed in the substrate 100, and peripheral gate electrodes PG. The peripheral transistors PT may be covered by a lower interlayer insulating layer 50. Peripheral circuit interconnection lines 33 may be electrically connected to the peripheral transistors PT through peripheral contact plugs 34.

Figure 10:
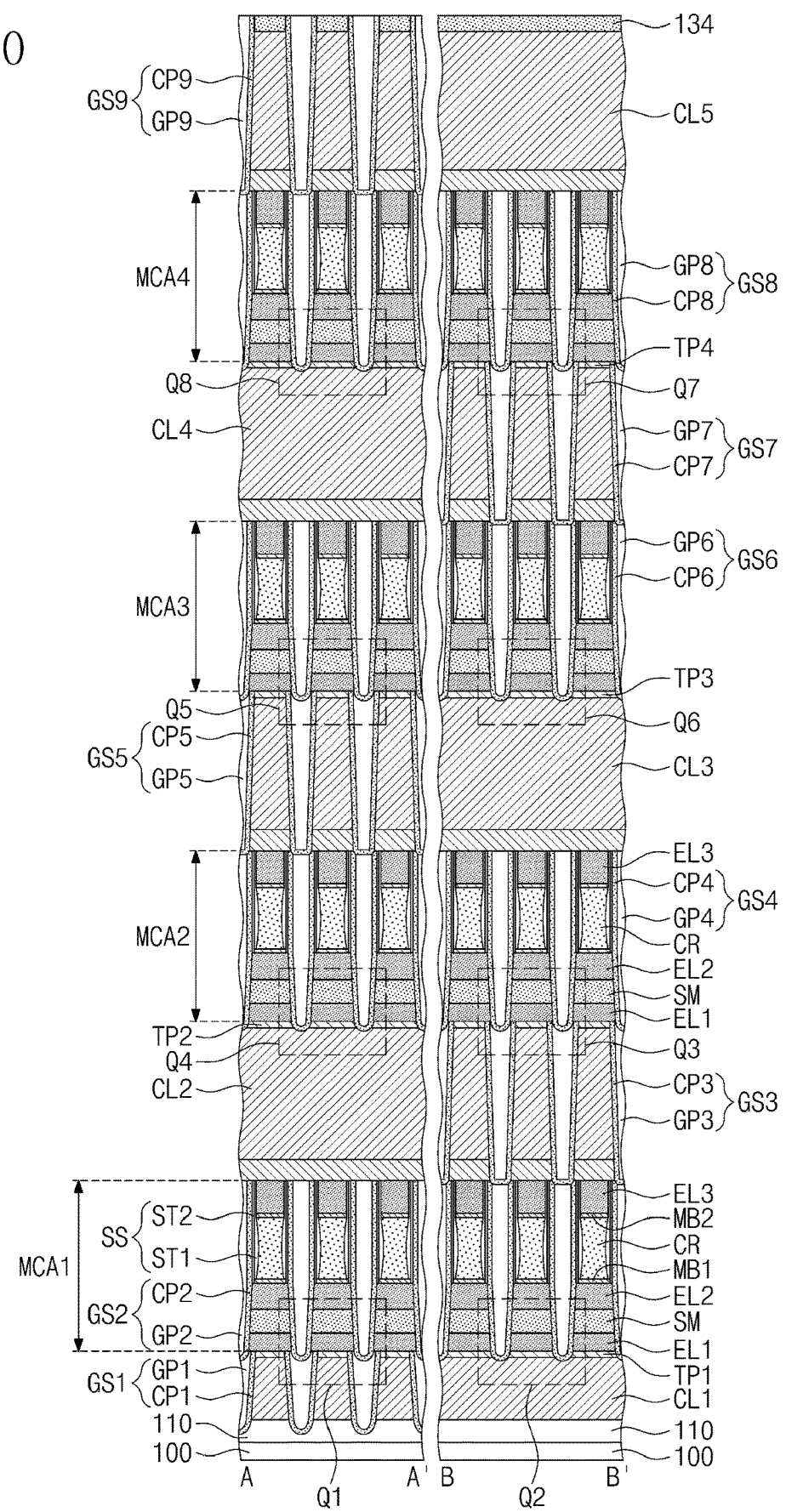
FIG. 10 is a cross-sectional view taken along the lines A-A' and B-B' of FIG. 3 to illustrate a variable resistance memory device according to some embodiments of the inventive concepts.

FIG. 10 is a cross-sectional view taken along the lines A-A' and B-B' of FIG. 3 to illustrate a variable resistance memory device according to some embodiments of the inventive concepts. Referring to FIGS. 2, 3 and 10, a variable resistance memory device according to some embodiments of the inventive concepts may include first to fourth memory cell stacks MCA1 to MCA4. The first and second memory cell stacks MCA1 and MCA2 and first to third conductive lines CL1, CL2 and CL3 may be the same as the ones in the embodiments described above.

Fourth conductive lines CL4 may be provided on the third conductive lines CL3, and fifth conductive lines CL5 may be provided on the fourth conductive lines CL4. The third memory cell stack MCA3 may be provided between the third conductive lines CL3 and the fourth conductive lines CL4, and the fourth memory cell stack MCA4 may be provided between the fourth conductive lines CL4 and the fifth conductive lines CL5. Components of each of the third and fourth memory cell stacks MCA3 and MCA4 may be substantially the same as the components of the second memory cell stack MCA2. A sixth filling structure GS6 may be provided to fill a space between cell structures of the third memory cell stack MCA3, and an eighth filling structure GS8 may be provided to fill a space between cell structures of the fourth memory cell stack MCA4. Each of the sixth and eighth filling structures GS6 and GS8 may be substantially the same as the fourth filling structure GS4 described above. For example, the sixth filling structure GS6 may include a sixth capping pattern CP6 and a sixth filling pattern GP6. The eighth filling structure GS8 may include an eighth capping pattern CP8 and an eighth filling pattern GP8.

The third conductive lines CL3 may include upper patterns TP3 as illustrated in regions 'Q5' and 'Q6' of FIG. 10, and the fourth conductive lines CL4 may include upper patterns TP4 as illustrated in regions 'Q7' and 'Q8' of FIG. 10. The descriptions to the region 'Q1' of FIG. 5A, 7A or 8A may be applied to the regions 'Q5' and 'Q7', and the descriptions to the region 'Q2' of FIG. 5B, 7B or 8B may be applied to the regions 'Q6' and 'Q8'. Seventh filling structures GS7 may be provided to fill spaces between the fourth conductive lines CL4. Each of the seventh filling structures GS7 may include a seventh capping pattern CP7 and a seventh filling pattern GP7. Ninth filling structures GS9 may be provided to fill spaces between the fifth conductive lines CL5. Each of the ninth filling structures GS9 may include a ninth capping pattern CP9 and a ninth filling pattern GP9. The ninth filling structures GS9, the fifth conductive lines CL5 and the upper mask pattern 134 illustrated in FIG. 10 may have the same structures and the same features as the fifth filling structures GS5, the third conductive lines CL3 and the upper mask pattern 134 illustrated in FIG. 4.

Figure 11:
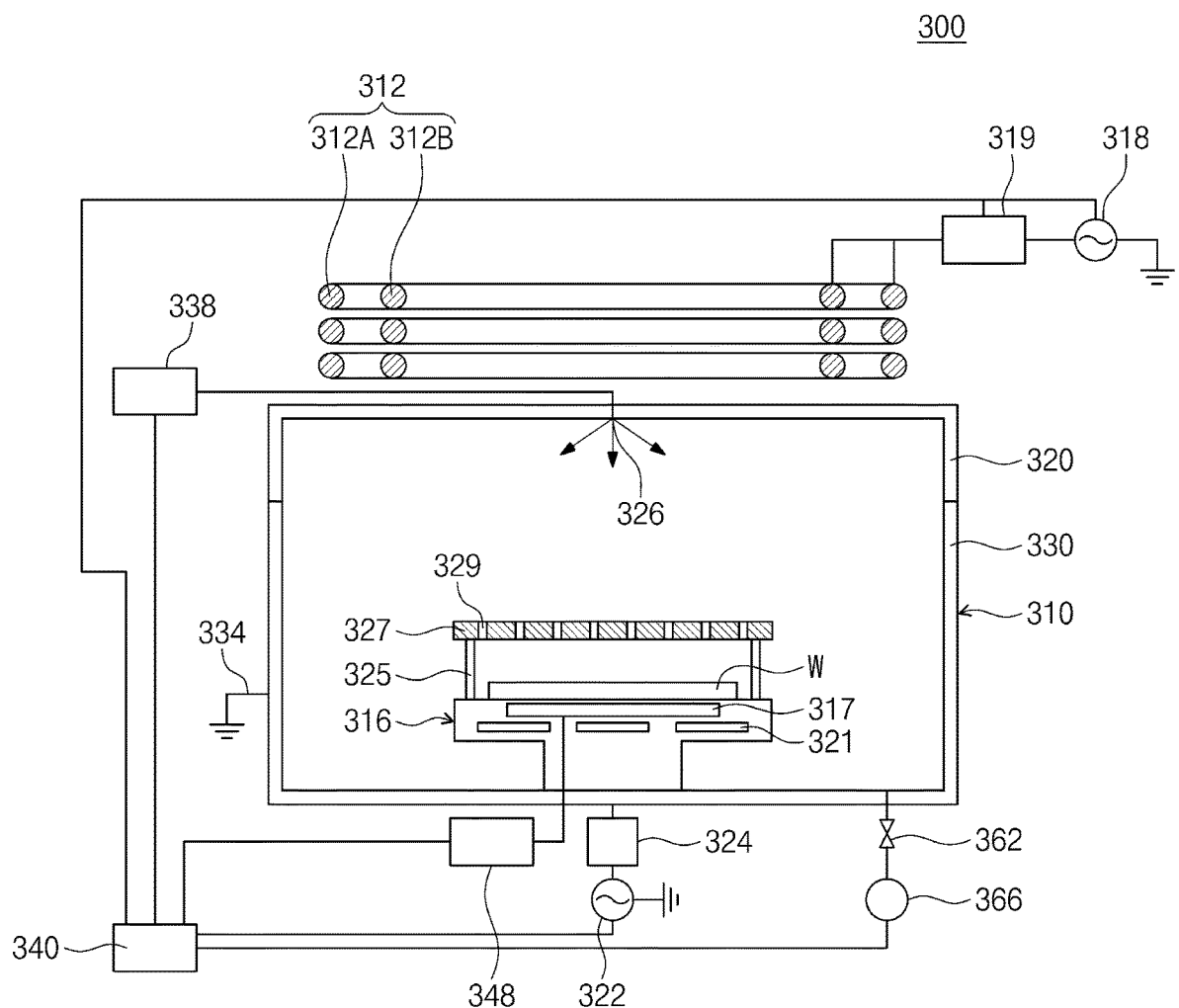
FIG. 11 is a conceptual view illustrating a decoupled plasma apparatus for forming at least a portion of conductive lines according to some embodiments of the inventive concepts.

FIG. 11 is a conceptual view illustrating a decoupled plasma apparatus 300 for forming at least a portion of conductive lines according to some embodiments of the inventive concepts.

The decoupled plasma apparatus 300 may include a process chamber 310 including a conductive body 330 and a dielectric ceiling 320. The conductive body 330 may be connected to a ground 334. At least one inductive coil antenna 312 may be disposed on the dielectric ceiling 320. In some embodiments, the inductive coil antenna 312 may include an outer coil 312A and an inner coil 312B. The inductive coil antenna 312 may be connected to a radio-frequency (RF) power source 318 through a second matching network 319. For example, the RF power source 318 may generate continuous or pulsed plasma by using a tunable frequency of an RF power in a range of 2 MHz to 13.56 MHz. The RF power source 318 and the second matching network 319 may be connected to a controller 340.

A substrate supporter 316 for supporting a wafer W may be provided in the process chamber 310. The substrate supporter 316 may be connected to a bias power source 322 through a first matching network 324. The bias power source 322 may be connected to the controller 340. For example, the bias power source 322 may generate continuous or pulsed power by using a frequency of 13.56 MHz. In certain embodiments, the bias power source 322 may be a DC source or a pulsed DC source.

The substrate supporter 316 may include a chucking device 317. A resistive heater 321 may be provided under the chucking device 317. A heat transfer gas source 348 may be connected to the chucking device 317. The heat transfer gas source 348 may be used to easily transfer heat between the substrate supporter 316 and the wafer W.

An ion-radical shield 327 may be provided on the substrate supporter 316. The ion-radical shield 327 may include a plurality of apertures 329. The ion-radical shield 327 may control a density of ions transferred to the wafer W by a distribution and sizes of the apertures 329. For example, the ion-radical shield 327 may include quartz. The ion-radical shield 327 may be supported by legs 325.

A gas panel 338 for supplying process gases into the process chamber 310 may be provided. The gas panel 338 may supply the process gases into the process chamber 310 through an inlet port 326 disposed in the dielectric ceiling 320. The gas panel 338 may be connected to the controller 340. A throttle valve 362 and a vacuum pump 366 may be provided to adjust a pressure in the process chamber 310.

FIGS. 12 to 21 are cross-sectional views taken along the lines A-A' and B-B' of FIG. 3 to illustrate a method of manufacturing a variable resistance memory device, according to some embodiments of the inventive concepts.

Figure 12:
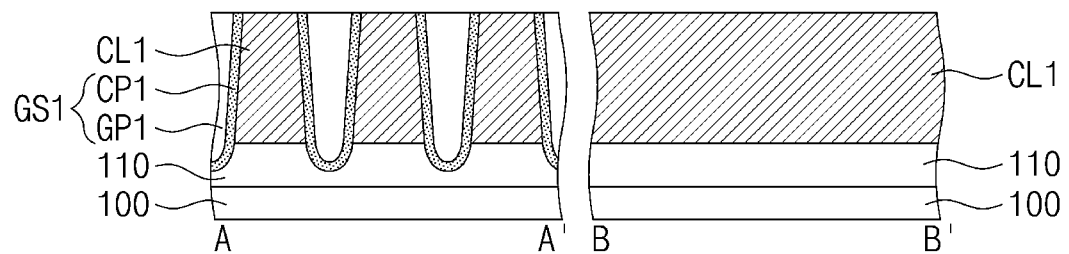
FIGS. 12 to 21 are cross-sectional views taken along the lines A-A' and B-B' of FIG. 3 to illustrate a method of manufacturing a variable resistance memory device, according to some embodiments of the inventive concepts.

Referring to FIGS. 3 and 12, an interlayer insulating layer 110 and first conductive lines CL1 may be formed on a substrate 100. The formation of the first conductive lines CL1 may include depositing a first conductive layer on the substrate 100, and etching the first conductive layer using mask patterns as an etch mask. For example, the first conductive layer may be formed by a physical vapor deposition (PVD) process or an atomic layer deposition (ALD) process.

The first conductive lines CL1 may have lower widths greater than upper widths and may have inclined sidewalls. First filling structures GS1 may be formed to fill trenches formed between the first conductive lines CL1. For example, a capping layer and a filling layer may be formed to sequentially cover inner surfaces of the trenches between the first conductive lines CL1, and then, a planarization process may be performed on the capping layer and the filling layer to form first capping patterns CP1 and first filling patterns GP1. For example, the capping layer may be formed by an ALD process. The first filling pattern GP1 may be formed using a layer-forming method having an excellent gap-fill property, for example, a flowable chemical vapor deposition (FCVD) method or a spin coating method. For example, the first filling pattern GP1 may be formed using a FCVD process using a SiOC material. For other examples, the first filling pattern GP1 may be formed using an ALD process, a CVD process, and/or a PVD process.

Figure 13:
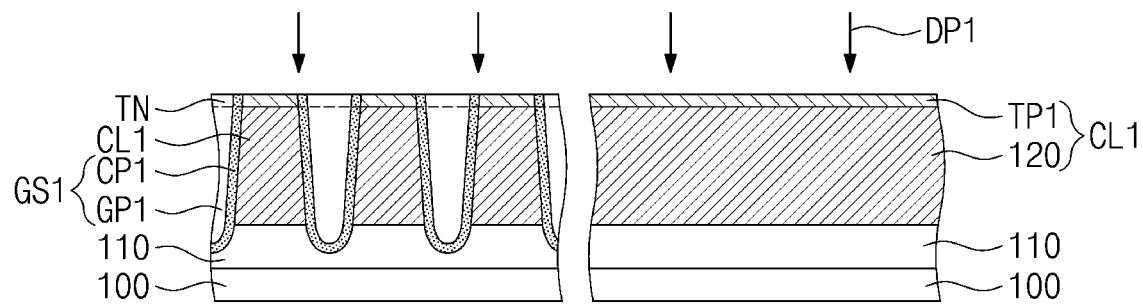

Referring to FIGS. 3, 11 and 13, a nitridation post-treatment process may be performed on upper portions of the first conductive lines CL1. Thus, an upper pattern TP1 may be formed in the upper portion of each of the first conductive lines CL1. For example, the nitridation process may be a first decoupled plasma nitridation process DP1 and may be performed in the decoupled plasma apparatus 300 described with reference to FIG. 11. For example, the first decoupled plasma nitridation process DP1 may be performed in such a way that the upper pattern TP1 is formed from a top surface of the first conductive line CL1 to a depth of about 5 Å to about 40 Å. In certain embodiments, the thickness t1 of the upper pattern TP1 may range from about 15 Å to about 150 Å.

Nitrogen regions TN may also be formed in upper portions of the first filling structures GS1 by the first decoupled plasma nitridation process DP1. For example, a region having the nitrogen concentration distribution described with reference to FIG. 6 may be formed in an upper portion of each of the first capping pattern CP1 and the first filling pattern GP1 by the first decoupled plasma nitridation process DP1. For example, the nitrogen region TN may be formed to substantially the same depth as a bottom surface TB of the upper pattern TP1.

The first decoupled plasma nitridation process DP1 may be performed in the process chamber 310 of FIG. 11. The first decoupled plasma nitridation process DP1 may include supplying process gases through the gas panel 338. The process gases may include $NH_3$ and/or $N_2$, and an inert gas.

The inert gas may include argon or helium. For example, the process gases may include a nitrogen source and a helium gas at a ratio of 1:1 to 1:10. For example, a flow rate of $NH_3$ may range from 0 sccm to 300 sccm (e.g., between 100 sccm to 200 sccm), and a flow rate of $N_2$ may range from 0 sccm to 1000 sccm (e.g., between 100 sccm to 800 sccm). A flow rate of the helium may range from 0 sccm to 1000 sccm (e.g., between 100 sccm to 800 sccm), and a flow rate of the argon may range from 100 sccm to 2000 sccm (e.g., between 100 sccm to 1500 sccm). By the first decoupled plasma nitridation process DP1, nitrogen may collide with the top surface of the first conductive line CL1, and a metal element of the top surface of the first conductive line CL1 may be replaced with nitrogen.

The first decoupled plasma nitridation process DP1 may be performed at a lower pressure than the process of forming the first capping pattern CP1 and/or the first filling pattern GP1. For example, the first decoupled plasma nitridation process DP1 may be performed at a pressure of 1 mtorr to 100 mtorr. The pressure of the first decoupled plasma nitridation process DP1 may be adjusted by the throttle valve 362 and the vacuum pump 366. The first decoupled plasma nitridation process DP1 may be performed at a temperature of about 25 degrees Celsius to about 250 degrees Celsius. The first decoupled plasma nitridation process DP1 may be performed for a process time shorter than that of the process of forming the first filling pattern GP1. For example, the first decoupled plasma nitridation process DP1 may be performed for a time of 30 seconds to 5 minutes. In the first decoupled plasma nitridation process DP1, power of the bias power source 322 may range from 300 W to 3000 W.

Figure 14:
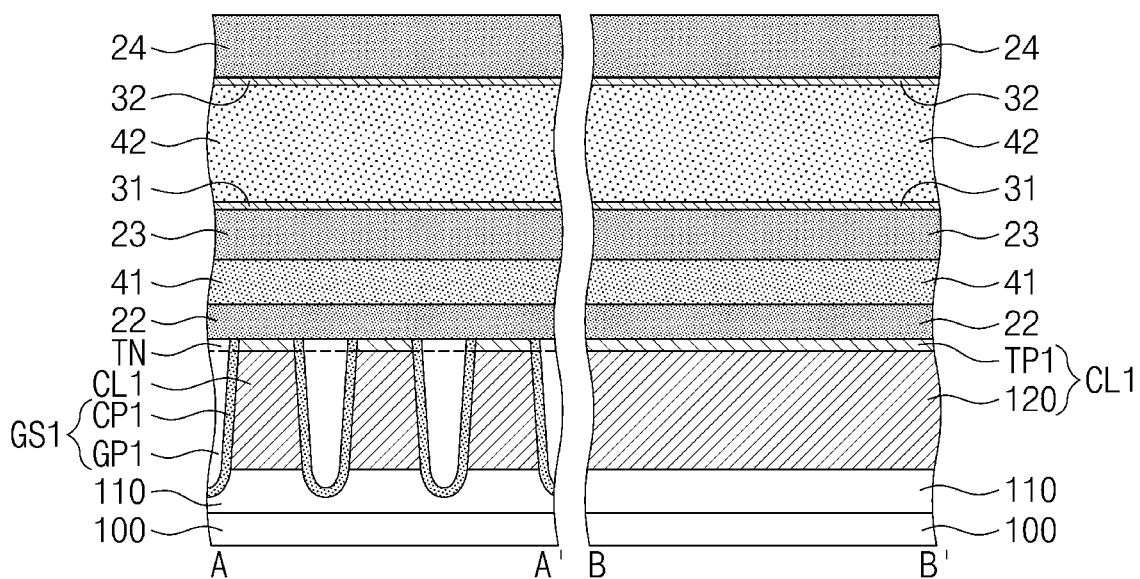

Referring to FIGS. 3 and 14, a second conductive layer 22, a switching layer 41, a third conductive layer 23, a first metal layer 31, a variable resistance layer 42, a second metal layer 32 and a fourth conductive layer 24 may be sequentially formed on the first conductive lines CL1. For example, the layers may be formed by at least one of a CVD process, a sputtering process, or an ALD process.

Figure 15:
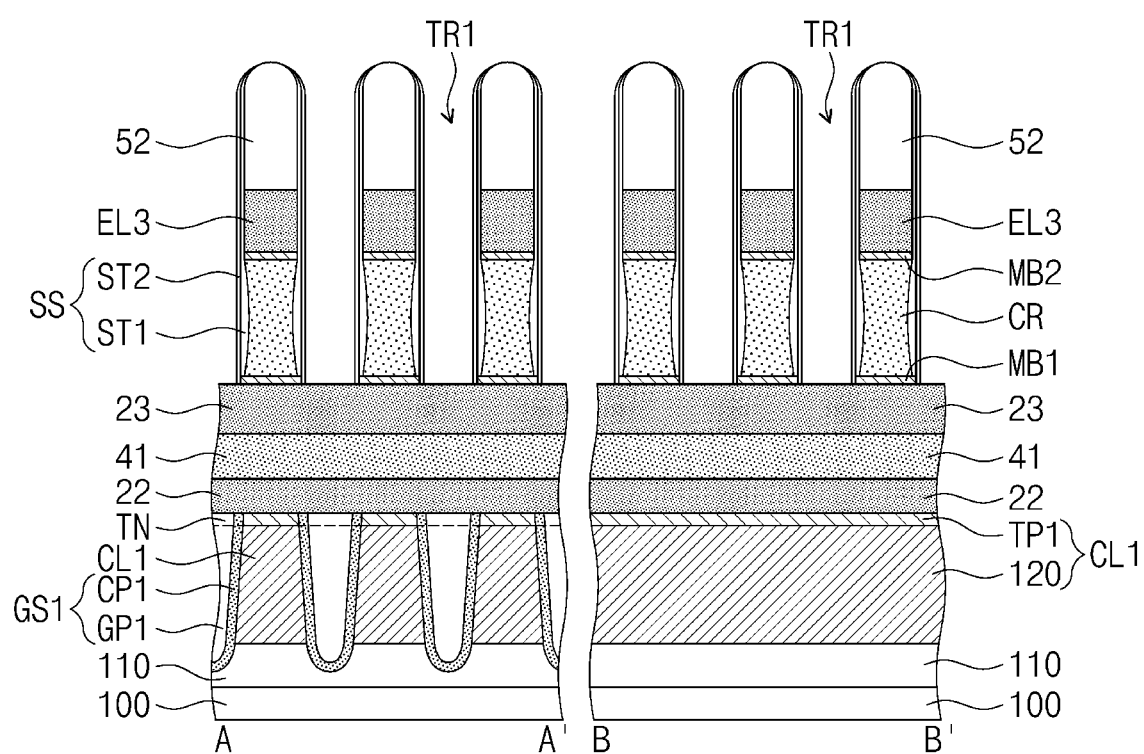

Referring to FIGS. 3 and 15, first mask patterns 52 may be formed on the fourth conductive layer 24. The first mask patterns 52 may include silicon nitride, silicon carbide, and/or silicon oxynitride. The fourth conductive layer 24, the second metal layer 32, the variable resistance layer 42 and the first metal layer 31 may be sequentially etched using the first mask patterns 52 as an etch mask to form a first trench TR1. As a result, lower electrode patterns MB1, variable resistance patterns CR, upper electrode patterns MB2 and third electrodes EL3 may be sequentially formed on the third conductive layer 23. For example, the first mask patterns 52 may be spaced apart from each other in the first direction D1 and the second direction D2. The etching process may include an ion beam etching process and/or a reactive ion etching process.

Recess portions may be formed at sidewalls/side surfaces of the variable resistance patterns CR. For example, the recess portions may be formed by performing a wet cleaning process using a cleaning solution having an etch selectivity to the variable resistance patterns CR. For example, the cleaning solution may etch the variable resistance patters CR at a higher rate than the other patterns and layers. Alternatively, the formation of the recess portions may be omitted. Spacer structures SS covering side surfaces of the variable resistance patterns CR may be formed. An insulating layer may be formed to cover sidewalls/side surfaces of the lower electrode patterns MB1, the upper electrode patterns MB2, the variable resistance patterns CR and the third electrodes EL3, and then, an anisotropic etching process may be performed on the insulating layer to form the spacer structures SS. For example, each of the spacer structures SS may include a first spacer ST1 and a second spacer ST2 which include different materials. The spacer structures SS may be formed using an ALD process and/or a CVD process.

Figure 16:
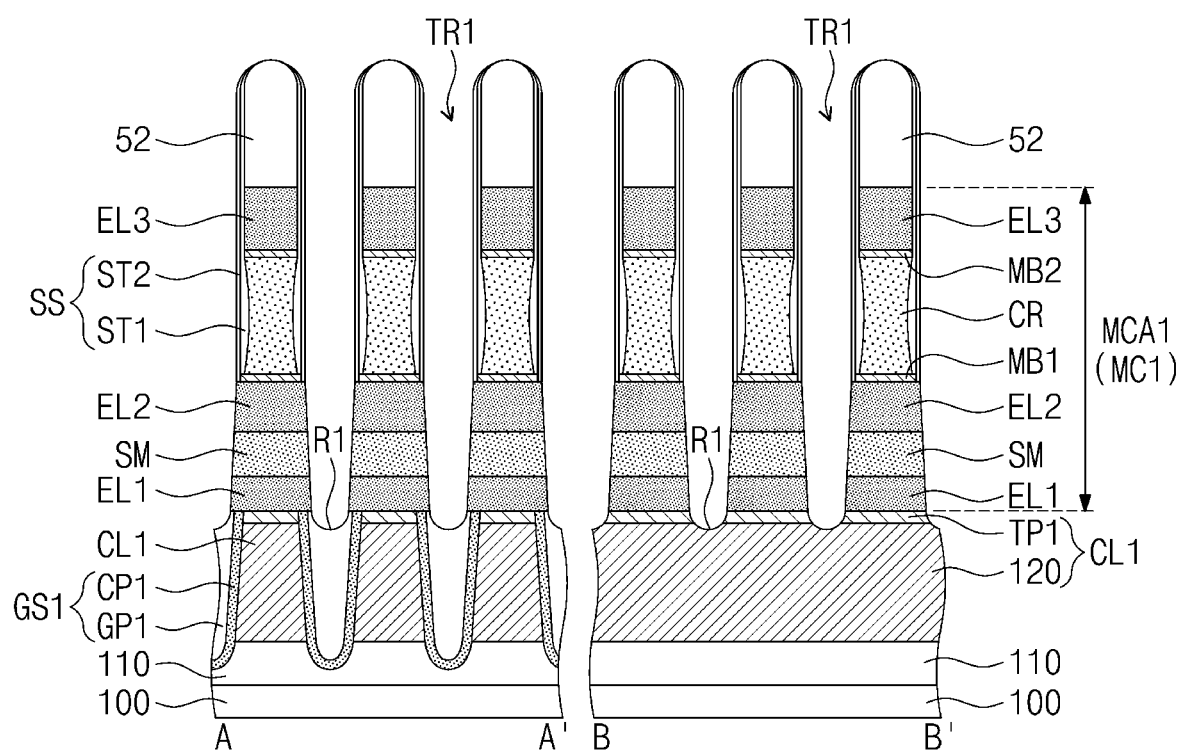

Referring to FIGS. 3 and 16, the third conductive layer 23, the switching layer 41 and the second conductive layer 22 may be sequentially etched to form second electrodes EL2, switching patterns SM and first electrodes EL1. As a result, a first memory cell stack MCA1 including first cell structures MC1 may be formed. The etching process may include an ion beam etching process and/or a reactive ion etching process. During the etching process, the first trench TR1 may further extend toward the substrate 100. For example, first recess regions R1 may be formed in upper portions of the first filling structures GS1.

Upper portions of the first conductive lines CL1 may also be etched in the etching process for forming the first memory cell stack MCA1. In this case, metal elements of the first conductive lines CL1 may be separated from their surfaces and then may permeate into the switching pattern SM. For example, a natural oxide layer (e.g., a metal oxide layer) may be formed on top surfaces of the first conductive lines CL1, and the metal oxide layer may be easily separated from the top surfaces of the first conductive lines CL1 in the etching process and may contaminate the switching pattern SM. In this case, a composition of the switching pattern SM may be changed by the metal elements permeated into the switching pattern SM.

However, the variable resistance memory device according to the embodiments of the inventive concepts may include the upper patterns containing nitrogen in the upper portions of the conductive lines. A bonding strength between a metal nitride and a metal layer thereunder may be stronger than a bonding strength between a metal oxide and a metal layer thereunder. Thus, the metal nitride layer may be helpful to reduce the amount of the metal separated from the conductive lines in the etching process for forming the memory cell stack. As a result, a change in composition of the switching pattern SM may be inhibited or prevented to improve endurance of the variable resistance memory device. For example, the switching pattern SM may be protected from being contaminated by metal compound coming from the conductive lines.

Figure 17:
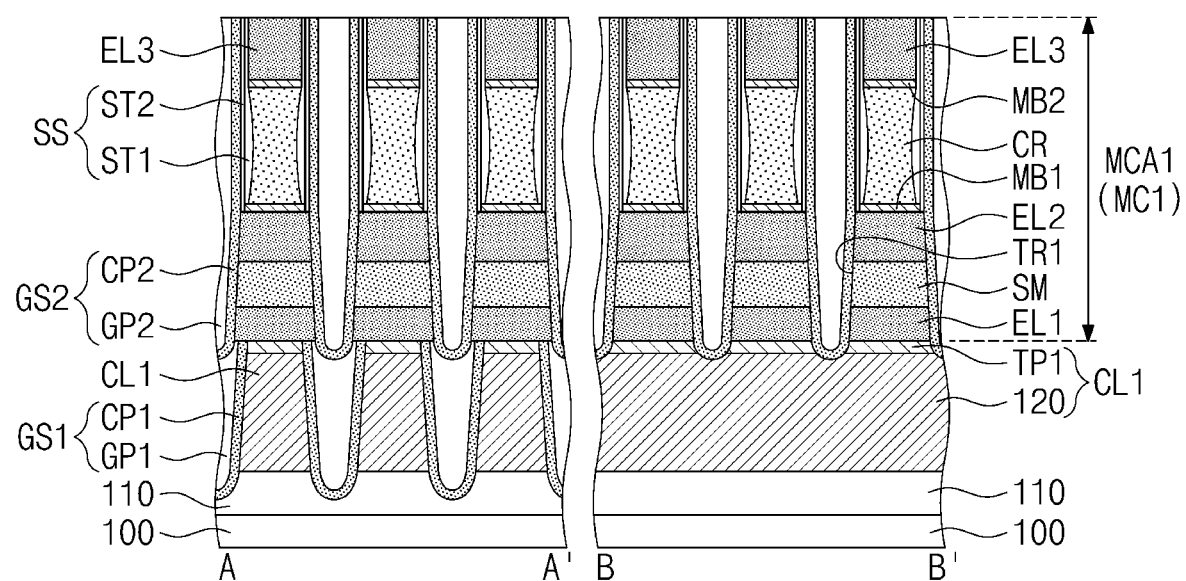

Referring to FIGS. 3 and 17, a second capping pattern CP2 and a second filling pattern GP2 may be formed to sequentially cover an inner surface of the first trench TR1. The second capping pattern CP2 and the second filling pattern GP2 may constitute a second filling structure GS2. The second capping pattern CP2 may extend downwards into the first recess regions R1 of FIG. 16. Thereafter, a planarization process may be performed to expose top surfaces of the third electrodes EL3. The second capping pattern CP2 may be formed using a CVD process, a PVD process, and/or an ALD process. After depositing the second capping pattern CP2, a post-treatment process may be performed to enhance a layer quality. For example, the post-treatment process may include at least one of a heat treatment process, an ultraviolet (UV) treatment process, or a plasma treatment process. An inert gas such as N, He, and/or Ar may be used in the post-treatment process.

Figure 18:
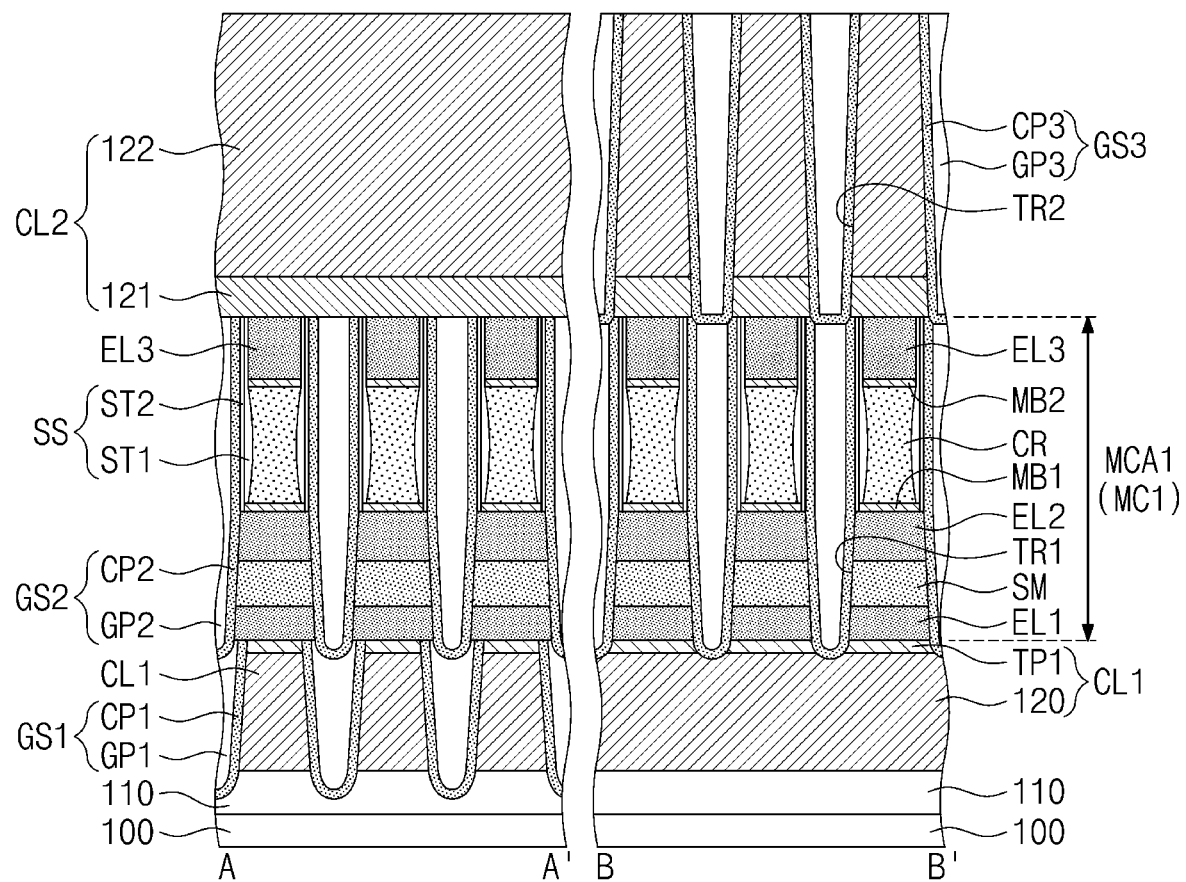

Referring to FIGS. 3 and 18, second conductive lines CL2 may be formed on the first memory cell stack MCA1. The formation of the second conductive lines CL2 may include sequentially forming a barrier layer and a metal layer, and etching the metal layer and the barrier layer using mask patterns as an etch mask to form second trenches TR2. As a result, the second conductive lines CL2, each of which includes a barrier pattern 121 and a lower pattern 122, may be formed. For example, the barrier layer and the metal layer may be formed by a PVD process or an ALD process. The mask patterns may include or may be formed of silicon nitride and/or silicon oxide.

A plurality of insulating layers sequentially covering inner surfaces of the second trenches TR2 may be formed, and a planarization process may be performed on the plurality of insulating layers to form third filling structures GS3, each of which includes a third capping pattern CP3 and a third filling pattern GP3. The third capping pattern CP3 and the third filling pattern GP3 may be formed of the same materials as the second capping pattern CP2 and the second filling pattern GP2 and may be formed by the same formation method as the second capping pattern CP2 and the second filling pattern GP2. Hereinafter, the same materials and the same formation method may also be applied to other capping patterns and other filling patterns.

Figure 19:
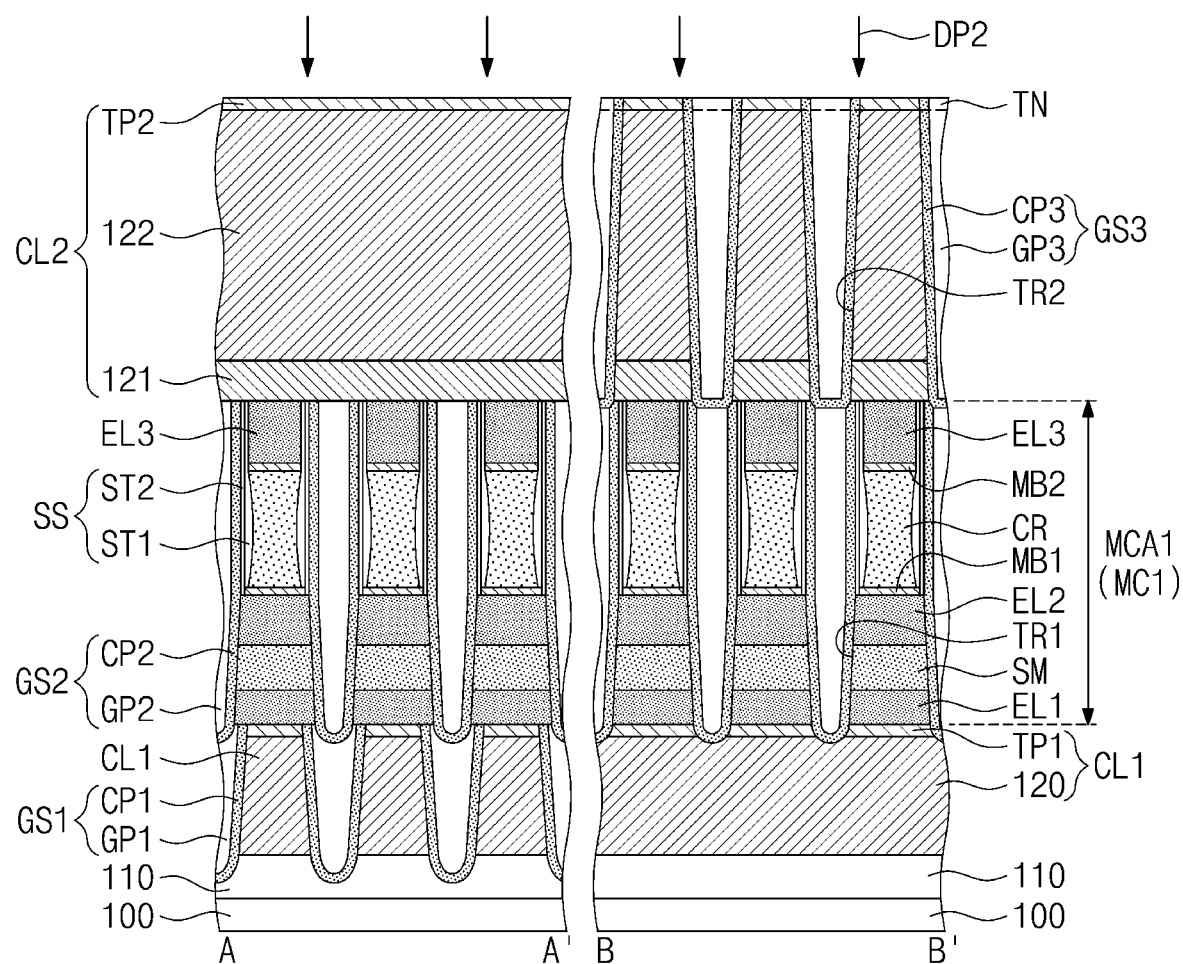

Referring to FIGS. 3 and 19, a nitridation post-treatment process may be performed on upper portions of the second conductive lines CL2. Thus, an upper pattern TP2 may be formed in the upper portion of each of the second conductive lines CL2. For example, the nitridation process may be a second decoupled plasma nitridation process DP2 and may be performed in the decoupled plasma apparatus 300 described with reference to FIG. 11. The second decoupled plasma nitridation process DP2 may be performed by the same method as the first decoupled plasma nitridation process DP1. Nitrogen regions TN may also be formed in upper portions of the third filling structures GS3 by the second decoupled plasma nitridation process DP2.

Figure 20:
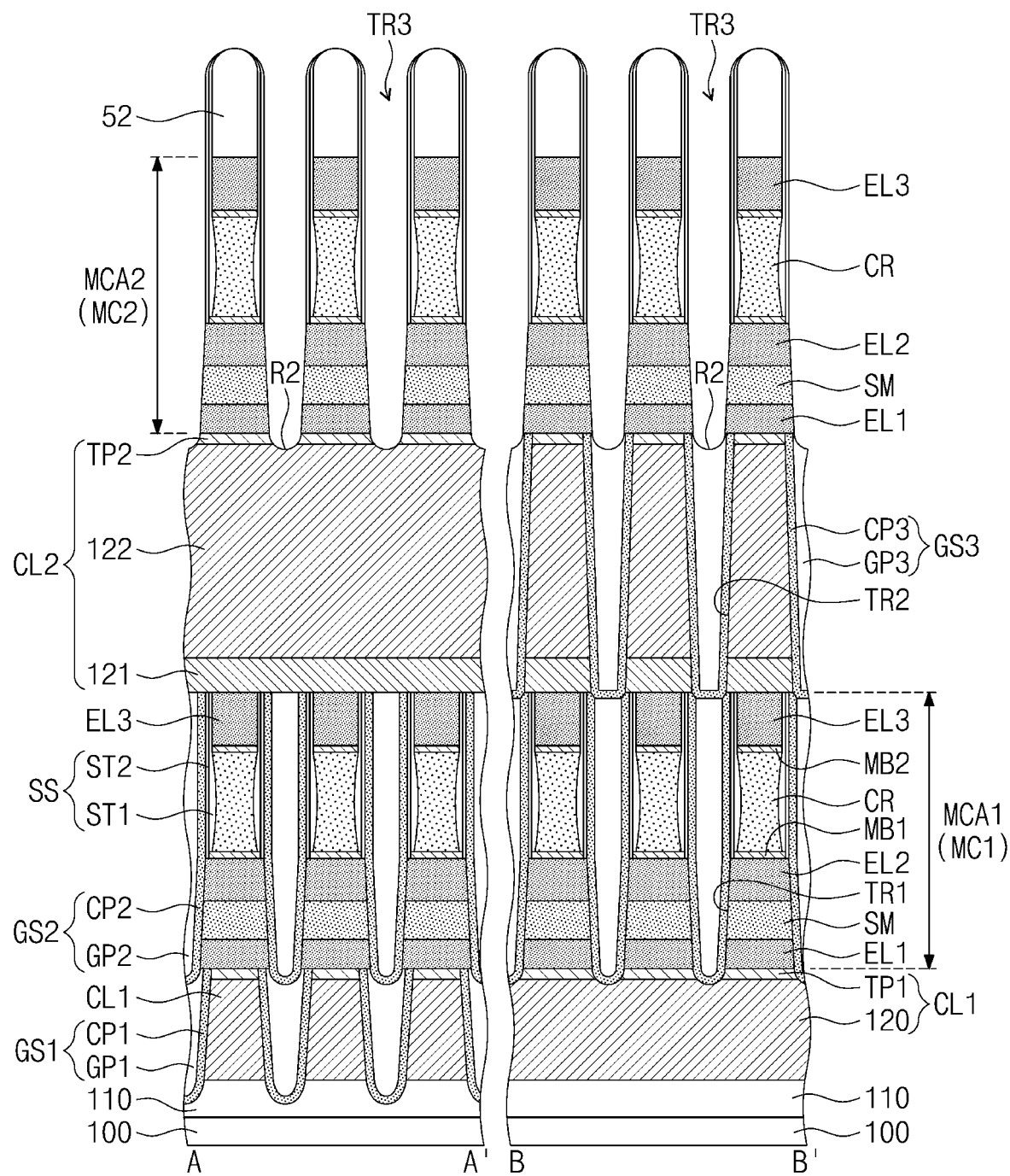

Referring to FIGS. 3 and 20, a second memory cell stack MCA2 including second cell structures MC2 may be formed on the second conductive lines CL2. The second cell structures MC2 may be formed by substantially the same method as the first cell structures MC1 described with reference to FIGS. 14 to 16. As a result, a third trench TR3 may be formed between the second cell structures MC2. Second recess regions R2 may be formed in upper portions of the third filling structures GS3.

Figure 21:
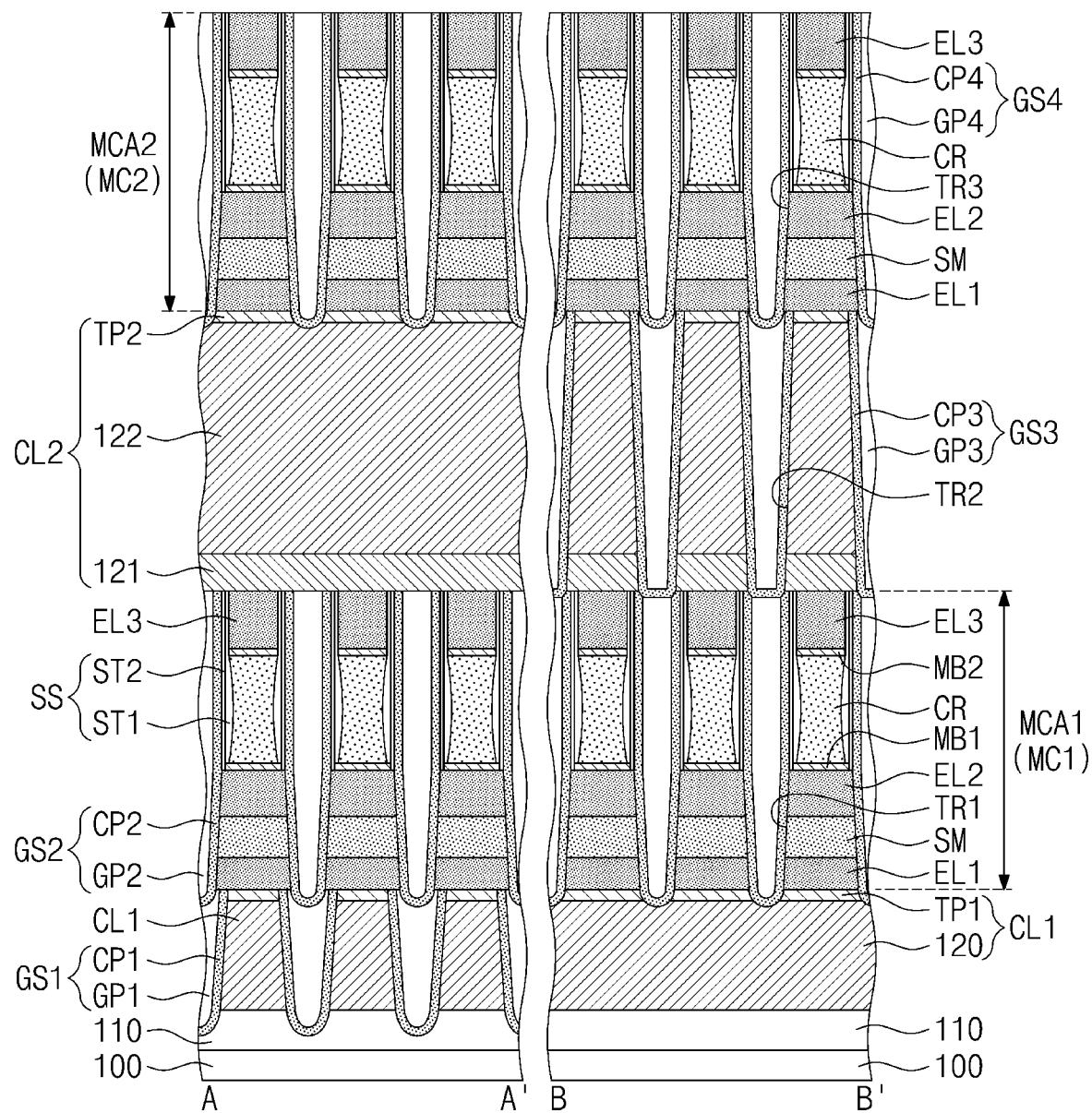

Referring to FIGS. 3 and 21, a fourth capping pattern CP4 and a fourth filling pattern GP4 may be formed to sequentially cover an inner surface of the third trench TR3. The fourth capping pattern CP4 and the fourth filling pattern GP4 may constitute a fourth filling structure GS4. The fourth capping pattern CP4 may fill the second recess regions R2. The fourth filling structure GS4 may be formed by substantially the same method as the second filling structure GS2 described with reference to FIG. 17.

Referring again to FIGS. 3 and 4, third conductive lines CL3 may be formed on the second memory cell stack MCA2. The formation of the third conductive lines CL3 may include sequentially forming a barrier layer and a metal layer, and etching the metal layer and the barrier layer using mask patterns 134 as an etch mask to form trenches. As a result, the third conductive lines CL3, each of which includes a barrier pattern 123 and a lower pattern 124, may be formed. Thereafter, a plurality of insulating layers may be formed on the third conductive lines CL3, and a planarization process may be performed on the plurality of insulating layers to form fifth filling structures GS5, each of which includes a fifth capping pattern CP5 and a fifth filling pattern GP5. An upper mask pattern 134 may remain after the planarization process. Alternatively, the upper mask pattern 134 may be removed from top surfaces of the third conductive lines CL3 after forming the third conductive lines CL3 or during the planarization process forming the fifth filling structures GS5.

According to the embodiments of the inventive concepts, a change in composition of the switching pattern may be inhibited or prevented to improve the endurance of the variable resistance memory device. For example, qualities and properties of the switching patterns of variable resistance memory devices may be protected by reducing contamination of the switching patterns according to embodiments of the present disclosure.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but descriptive/illustrative. Thus, the scope of the invention should be determined by the broadest permissible interpretation of the following claims and their equivalents, and shall not be restricted or limited by the foregoing description.

What is claimed is:

1. A variable resistance memory device comprising:
   first conductive lines extending in a first direction;
   second conductive lines extending in a second direction and crossing the first conductive lines in a plan view; and
   cell structures respectively provided at crossing points of the first conductive lines and the second conductive lines in the plan view,
   wherein each of the cell structures comprises a switching pattern, a variable resistance pattern, and a first electrode provided between the switching pattern and a first conductive line, the first electrode including carbon,
   wherein each of the first conductive lines comprises an upper pattern including a metal nitride in an upper portion thereof, and
   wherein the upper pattern is in contact with a bottom surface of the first electrode.

2. The variable resistance memory device of claim 1, wherein a nitrogen concentration of the upper pattern decreases moving from a top surface toward a bottom surface of the upper pattern.

3. The variable resistance memory device of claim 1, wherein each of the first conductive lines comprises a lower pattern provided under the upper pattern, and
   wherein the lower pattern and the upper pattern include the same metal element.

4. The variable resistance memory device of claim 3, wherein each of the first conductive lines comprises a plurality of upper patterns, and
   wherein the upper patterns are spaced apart from each other on the lower pattern.

5. The variable resistance memory device of claim 4, further comprising:
   first filler structures interposed between the first conductive lines and extending in the first direction; and
   a second filler structure interposed between the cell structures,
   wherein the upper patterns are separated from each other in the first direction with the second filler structure interposed therebetween.

6. The variable resistance memory device of claim 1, further comprising:
   first filler structures interposed between the first conductive lines and extending in the first direction; and a second filler structure interposed between the cell structures,
wherein the second filler structure includes a first bottom surface being in contact with the first filler structures and a second bottom surface being in contact with the first conductive lines, and the first bottom surface is positioned at a lower level than the second bottom surface.

7. The variable resistance memory device of claim 1, wherein the upper pattern extends in the first direction and is in contact with a plurality of first electrodes of the cell structures.

8. The variable resistance memory device of claim 7, wherein the upper pattern includes recess regions between the first electrodes in the plan view.

9. The variable resistance memory device of claim 1, wherein each of the first conductive lines comprises a lower pattern provided under the upper pattern and including a metal layer, and
wherein a thickness of the upper pattern ranges from about 5% to about 50% of a thickness of the lower pattern.

10. The variable resistance memory device of claim 1, wherein each of the first conductive lines comprises a lower pattern provided under the upper pattern and including a metal layer,
wherein a thickness of the upper pattern ranges from about 5 Å to about 40 Å, and
wherein a thickness of the lower pattern ranges from about 300 Å to about 500 Å.

11. The variable resistance memory device of claim 1, wherein a nitrogen concentration of the upper pattern ranges from about 5 at % to about 50 at %.

12. A variable resistance memory device comprising:
first conductive lines extending in a first direction;
second conductive lines extending in a second direction and crossing the first conductive lines in a plan view; and
cell structures respectively provided at crossing points of the first conductive lines and the second conductive lines in the plan view,
wherein each of the cell structures comprises a switching pattern and a variable resistance pattern,
wherein each of the first conductive lines includes first regions vertically overlapping the cell structures and second regions disposed between the first regions, and
wherein a nitrogen concentration of upper portions of the first regions is higher than that of upper portions of the second regions.

13. The variable resistance memory device of claim 12, wherein top surfaces of the second regions are lower than top surfaces of the first regions.

14. The variable resistance memory device of claim 12, wherein a nitrogen concentration of each of the upper portions of the first regions gradually decreases as a distance down from a top surface thereof increases.

15. The variable resistance memory device of claim 12, further comprising:
first filler structures disposed between the first conductive lines and extending in the first direction,
wherein a nitrogen concentration of each of the first filler structures gradually decreases as a distance down from a top surface thereof increases.

16. The variable resistance memory device of claim 12, wherein each of the first conductive lines comprises a lower pattern and an upper pattern,
wherein the lower pattern includes a metal layer, and the upper pattern includes a metal nitride layer,
wherein the metal layer and the metal nitride layer include the same metal element.

17. The variable resistance memory device of claim 16, wherein each of the first conductive lines comprises a plurality of upper patterns, and
wherein the upper patterns are spaced apart from each other in the first direction on the lower pattern.

18. The variable resistance memory device of claim 16, wherein the upper pattern extends in the first direction and is in contact with a plurality of cell structures.

19. A variable resistance memory device comprising:
first conductive lines extending in a first direction;
second conductive lines extending in a second direction and crossing the first conductive lines in a plan view;
cell structures respectively provided at crossing points of the first conductive lines and the second conductive lines in the plan view;
first filler structure s interposed between the first conductive lines;
a second filler structure interposed between the cell structures; and
third filler structures interposed between the second conductive lines,
wherein each of the cell structures comprises:
a first electrode;
a switching pattern on the first electrode;
a second electrode on the switching pattern;
a variable resistance pattern on the second electrode; and
a third electrode on the variable resistance pattern,
wherein each of the first conductive lines comprises an upper pattern including a metal nitride in an upper portion thereof, and
wherein the upper pattern is in contact with a bottom surface of the first electrode.

20. The variable resistance memory device of claim 19, wherein a nitrogen concentration of the upper pattern decreases moving downwards from a top surface toward a bottom surface of the upper pattern.

* * * * *